US012759867B2

(12) United States Patent
Lee et al.

(10) Patent No.: US 12,759,867 B2
(45) Date of Patent: Oct. 13, 2026

(54) MEMS STRUCTURE WITH REDUCED PEELING AND METHODS FORMING THE SAME

(71) Applicant: Taiwan Semiconductor Manufacturing Co., Ltd., Hsinchu (TW)

(72) Inventors: Pei-Wei Lee, Kaohsiung City (TW); Fu Wei Liu, Tainan (TW); Szu-Hsien Lee, Tainan City (TW); Yun-Chung Wu, Taipei City (TW); Chin-Yu Ku, Hsinchu (TW); Ming-Da Cheng, Taoyuan City (TW); Mirng-Ji Lii, Sinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 749 days.

(21) Appl. No.: 18/151,689

(22) Filed: Jan. 9, 2023

(65) Prior Publication Data

US 2024/0034619 A1 Feb. 1, 2024

Related U.S. Application Data

(60) Provisional application No. 63/378,783, filed on Oct. 7, 2022, provisional application No. 63/369,670, filed on Jul. 28, 2022.

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81B 2207/097* (2013.01)

(58) Field of Classification Search
CPC .............. B81B 7/007; B81B 2207/097; B81C 1/00301
See application file for complete search history.

(56) References Cited

U.S. PATENT DOCUMENTS

| | | | |
|---|---|---|---|
| 7,452,795 | B2 | 11/2008 | Iba |
| 11,658,069 | B2 | 5/2023 | Chen et al. |
| 2010/0090304 | A1 | 4/2010 | Liu et al. |

(Continued)

FOREIGN PATENT DOCUMENTS

| | | | |
|---|---|---|---|
| CN | 1873944 | A | 12/2006 |
| CN | 113173558 | A | 7/2021 |

(Continued)

*Primary Examiner* — Samuel A Gebremariam
(74) *Attorney, Agent, or Firm* — Slater Matsil, LLP

(57) ABSTRACT

A method includes forming an interconnect structure over a semiconductor substrate. The interconnect structure includes a plurality of dielectric layers, and the interconnect structure and the semiconductor substrate are in a wafer. A plurality of metal pads are formed over the interconnect structure. A plurality of through-holes are formed to penetrate through the wafer. The plurality of through-holes include top portions penetrating through the interconnect structure, and middle portions underlying and joining to the top portions. The middle portions are wider than respective ones of the top portions. A metal layer is formed to electrically connect to the plurality of metal pads. The metal layer extends into the top portions of the plurality of through-holes.

20 Claims, 25 Drawing Sheets

(56) References Cited

U.S. PATENT DOCUMENTS

| | | | | |
|---|---|---|---|---|
| 2015/0175406 | A1* | 6/2015 | Lin | B81B 7/007 438/51 |
| 2019/0002275 | A1 | 1/2019 | Chang et al. | |
| 2021/0134669 | A1 | 5/2021 | Huang et al. | |
| 2022/0165694 | A1 | 5/2022 | Huang | |
| 2022/0384259 | A1 | 12/2022 | Cheng et al. | |
| 2024/0379439 | A1 | 11/2024 | Chen et al. | |
| 2024/0410855 | A1 | 12/2024 | Chang et al. | |
| 2025/0316644 | A1 | 10/2025 | Lin et al. | |
| 2025/0353735 | A1* | 11/2025 | Lee | B81B 7/007 |

FOREIGN PATENT DOCUMENTS

| | | | |
|---|---|---|---|
| CN | 113270390 | A | 8/2021 |
| CN | 113307222 | A | 8/2021 |
| CN | 113517221 | A | 10/2021 |
| CN | 114551398 | A | 5/2022 |
| DE | 102020124131 | A1 | 9/2021 |
| DE | 102020124580 | A1 | 9/2021 |
| DE | 102020125201 | A1 | 9/2021 |
| JP | 2006332289 | A | 12/2006 |
| JP | 4648087 | B2 | 3/2011 |
| KR | 20060124531 | A | 12/2006 |
| KR | 20210110173 | A | 9/2021 |
| KR | 20210122705 | A | 10/2021 |
| TW | 202119583 | A | 5/2021 |
| TW | 202213544 | A | 4/2022 |

* cited by examiner

MEMS STRUCTURE WITH REDUCED PEELING AND METHODS FORMING THE SAME

PRIORITY CLAIM AND CROSS-REFERENCE

This application claims the benefit of the following provisionally filed U.S. Patent application: Application No. 63/378,783, filed on Oct. 7, 2022, and entitled "MEMS Structure with Reduced Peeling and Methods Forming the Same," and Application No. 63/369,670, filed on Jul. 28, 2022, and entitled "MEMS Structure for Precise Charged Particle Path Control and Density Improvement," which applications are hereby incorporated herein by reference.

BACKGROUND

Micro Electro Mechanical System (MEMS) devices have been used in many applications. For example, MEMS devices may be used for the controlling of implantations, in which ion implantation processes are performed, and used the formation of lithography masks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
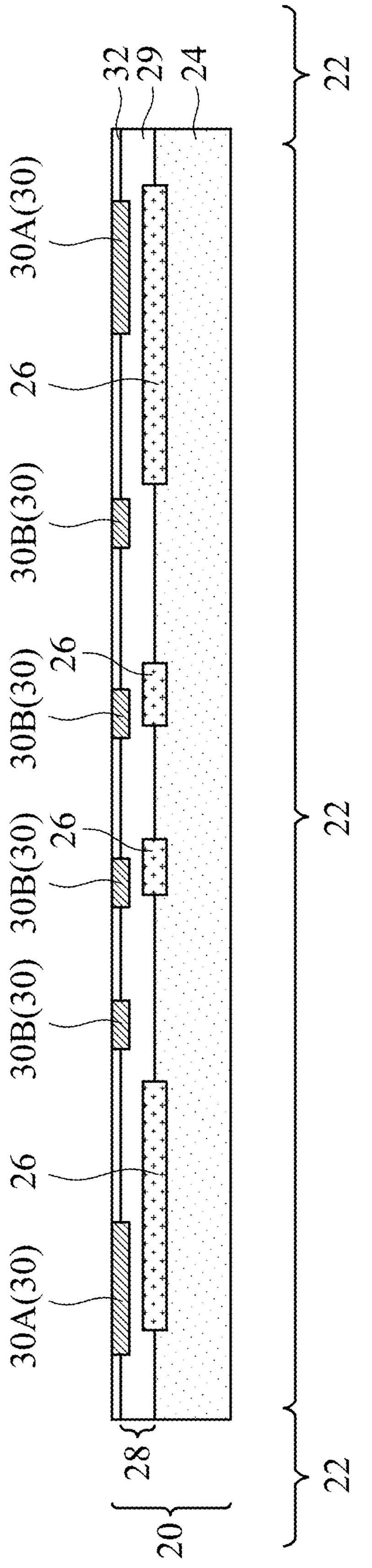
FIGS. 1-19 illustrate the cross-sectional views of a Micro Electro Mechanical System (MEMS) device including a plurality of through-holes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Micro Electro Mechanical System (MEMS) device having through-holes that have lower parts wider than upper parts and the method forming the same are provided. In accordance with some embodiments, the MEMS device includes a die with a semiconductor substrate, and an interconnect structure over the semiconductor substrate is formed. Through-holes are formed in the die. Lower portions of the through-holes are formed as being wider than the respective upper portions. A metal layer is formed to cover the sidewalls of the narrower upper portions of the through-holes. The wider lower portions of the through-holes may or may not be covered by a metal layer. With the lower portions of the through-holes being wider than the upper portions, either the metal layer does not extend to the sidewalls of the lower portions, or the metal layer may be formed on the lower portions with better quality. Accordingly, the peeling of the metal layer from the deep portions of the through-holes is eliminated. The through-holes may be used as the controlled paths for charged particles to pass through. Accordingly, the respective MEMS device have better control in the paths of the charged particles.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 26:
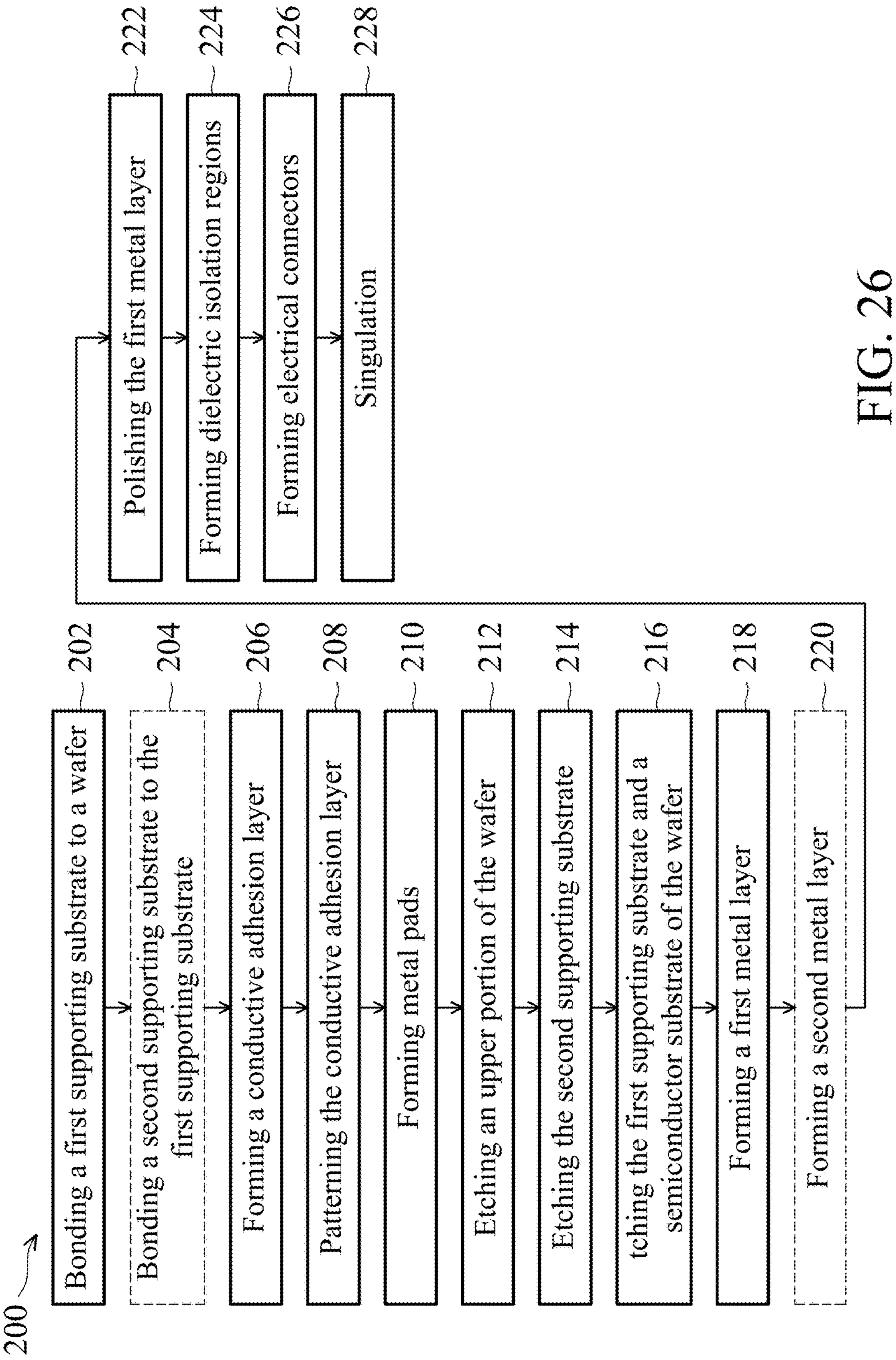
FIG. 26 illustrates a process flow for forming a MEMS device in accordance with some embodiments.

FIGS. 1 through 19 illustrate the cross-sectional views of intermediate stages in the formation of a MEMS device in accordance with some embodiments. The corresponding processes are also reflected schematically in the process flow 200 as shown in FIG. 26.

FIG. 1 illustrates a cross-sectional view of device 20. In accordance with some embodiments, device 20 is or comprises a device wafer including active devices and possibly passive devices, which are represented as integrated circuit devices 26. Device 20 may include a plurality of identical chips 22 therein, with one of chips 22 being illustrated. In subsequent discussion, a device wafer is used as an example of device 20, and device 20 is accordingly referred to as wafer 20.

In accordance with some embodiments, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like.

Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24.

Figure 19:
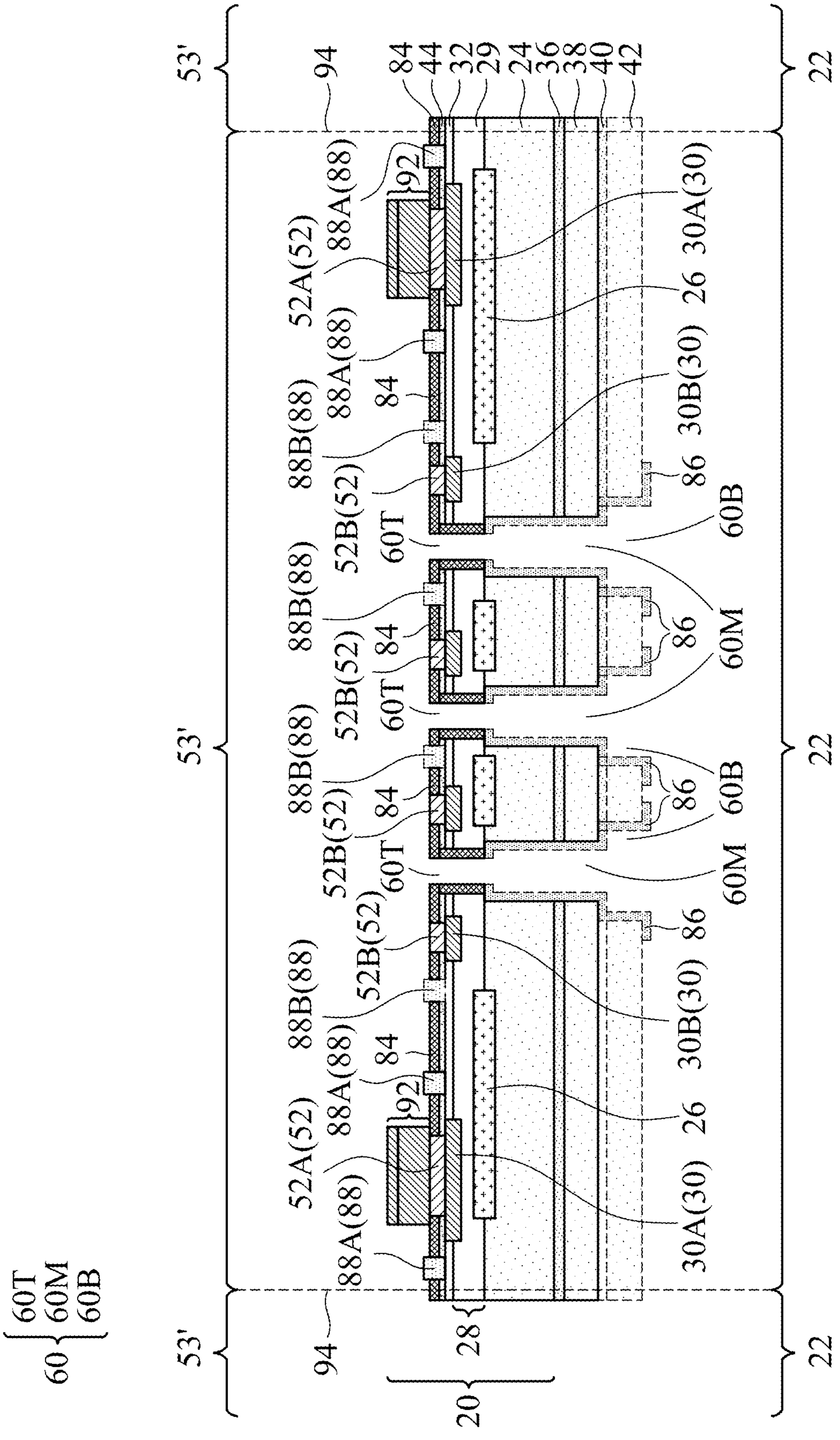

In accordance with some embodiments, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and/or the like in accordance with some embodiments. Integrated circuit devices 26 may include the control circuits for controlling the application of voltages to the conductive features around through-holes, as will be discussed in subsequent paragraphs. The details of integrated circuit devices 26 are not illustrated herein. In accordance with some embodiments, as shown in FIG. 19, a portion of the semiconductor substrate 24 may have through-holes 60, and integrated circuit devices 26 are formed in the regions spaced apart from through-holes 60.

Interconnect structure 28 is formed over semiconductor substrate 24 and integrated circuit devices 26. In accordance with some embodiments, interconnect structure 28 includes a plurality of dielectric layers 29. Dielectric layers 29 may include an Inter-Layer Dielectric (ILD, not shown separately) formed over semiconductor substrate 24 and filling the spaces between the gate stacks of transistors (not shown) in integrated circuit devices 26. In accordance with some embodiments, the ILD is formed of or comprises Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride, a low-k dielectric material, or the like. The ILD may be formed using spin-on coating, Flowable Chemical Vapor Deposition (FCVD), or the like. In accordance with some embodiments, the ILD is formed using a deposition process such as Plasma Enhanced Chemical Vapor Deposition (PECVD), Low Pressure Chemical Vapor Deposition (LPCVD), or the like.

Interconnect structure 28 may further include contact plugs (not shown) formed in the ILD, with the contact plugs being used to electrically connect integrated circuit devices 26 to overlying metal lines and vias. In accordance with some embodiments, the contact plugs are formed of or comprise a conductive material selected from tungsten, aluminum, copper, titanium, tantalum, titanium nitride, tantalum nitride, alloys therefore, and/or multi-layers thereof. The formation of the contact plugs may include forming contact openings in the ILD, filling a conductive material(s) into the contact openings, and performing a planarization process (such as a Chemical Mechanical Polish (CMP) process or a mechanical grinding process) to level the top surfaces of the contact plugs with the top surface of the ILD.

Interconnect structure 28 further includes metal lines and vias (not shown), which are formed in dielectric layers (also referred to as Inter-metal Dielectrics (IMDs), which are parts of dielectric layers 29). The metal lines at a same level are collectively referred to as a metal layer hereinafter. The metal lines in different metal layers are interconnected through vias. The metal lines and vias may be formed of copper or copper alloys, and can also be formed of other metals. In accordance with some embodiments, the IMDs are formed of low-k dielectric materials. The dielectric constants (k values) of the low-k dielectric materials may be lower than about 3.0, for example. The IMDs may comprise a carbon-containing low-k dielectric material, Hydrogen SilsesQuioxane (HSQ), MethylSilsesQuioxane (MSQ), or the like. The formation of the metal lines and the vias may include single damascene processes and/or dual damascene processes.

As shown in FIG. 1, metal pads 30 (including metal pads 30A and 30B) are formed over interconnect structure 28, and are electrically connected to integrated circuit devices 26. In accordance with some embodiments, metal pads 30 are formed of or comprise aluminum, copper, aluminum copper, or the like.

Passivation layer 32 is formed over interconnect structure 28. In accordance with some embodiments, passivation layer 32 is formed of a non-low-k dielectric material having a dielectric constant equal to or greater than the dielectric constant of silicon oxide. Passivation layer 32 may be formed of or comprise an inorganic dielectric material, which may include a material selected from, and is not limited to, silicon nitride, silicon oxide, silicon carbide, silicon oxy-nitride, silicon oxy-carbide, or the like, combinations thereof, and/or multi-layers thereof. The formation process may include LPCVD, Plasma Enhanced Chemical Vapor Deposition (PECVD), Physical Vapor Deposition (PVD), Atomic Layer Deposition (ALD), or the like. In accordance with some embodiments, the top surfaces of passivation layer 32 and metal lines/pads 30 have portions at the same level.

Passivation layer 32 is patterned to form openings, through which the metal pads 30 are revealed. In accordance with some embodiments, the revealing of metal pads 30 is performed by planarizing passivation layer 32, so that the portions of passivation layer 32 over metal pads 30 are removed. The top surfaces of metal pads 30 and passivation layer 32 are thus coplanar with each other. In accordance with alternative embodiments, passivation layer 32 is patterned through an etching process, for example, using a patterned photoresist as an etching mask. Accordingly, passivation layer 32 may extend on, and covering the edge portions of, metal pads 30.

Figure 2:
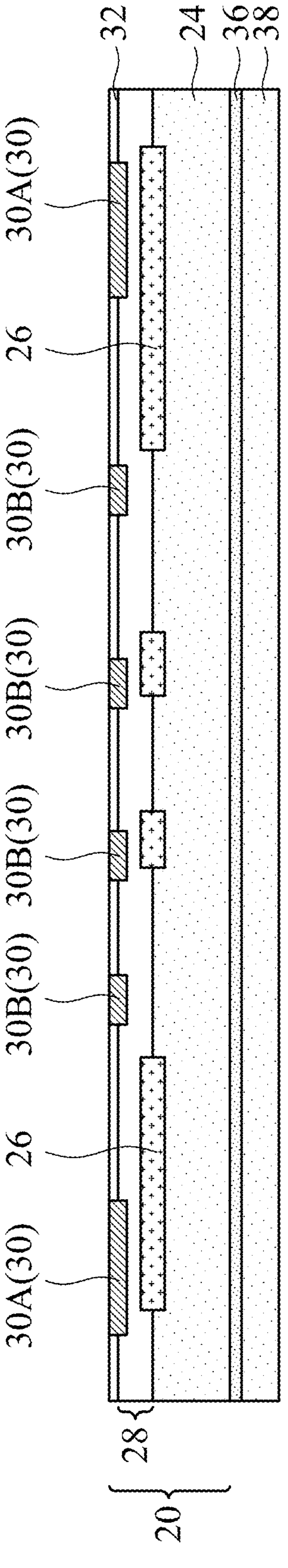

Referring to FIG. 2, supporting substrate 38 is bonded to wafer 20. The respective process is illustrated as process 202 in the process flow 200 as shown in FIG. 26. Supporting substrate 38 may be bonded to semiconductor substrate 24 through bond layer 36. In accordance with some embodiments, bond layer 36 is deposited on semiconductor substrate 24, and then supporting substrate 38 is bonded to semiconductor substrate 24 through bond layer 36. In accordance with alternative embodiments, bond layer 36 is pre-formed on supporting substrate 38, for example, through thermal oxidation or a deposition process, and the structure including both of bond layer 36 and supporting substrate 38 are bonded to semiconductor substrate 24.

Bond layer 36 may be a silicon-containing dielectric layer formed of or comprising $SiO_2$, SiN, SiC, SiON, or the like. The deposition process may include LPCVD, PECVD, PVD, ALD, PEALD, or the like. Supporting substrate 38 may be a silicon substrate in accordance with some embodiments, while another type of substrate such as semiconductor substrate, a dielectric substrate, or the like may be used. The bonding of bond layer 36 to supporting substrate 38 and semiconductor substrate 24 may include fusion bonding.

Figure 3:
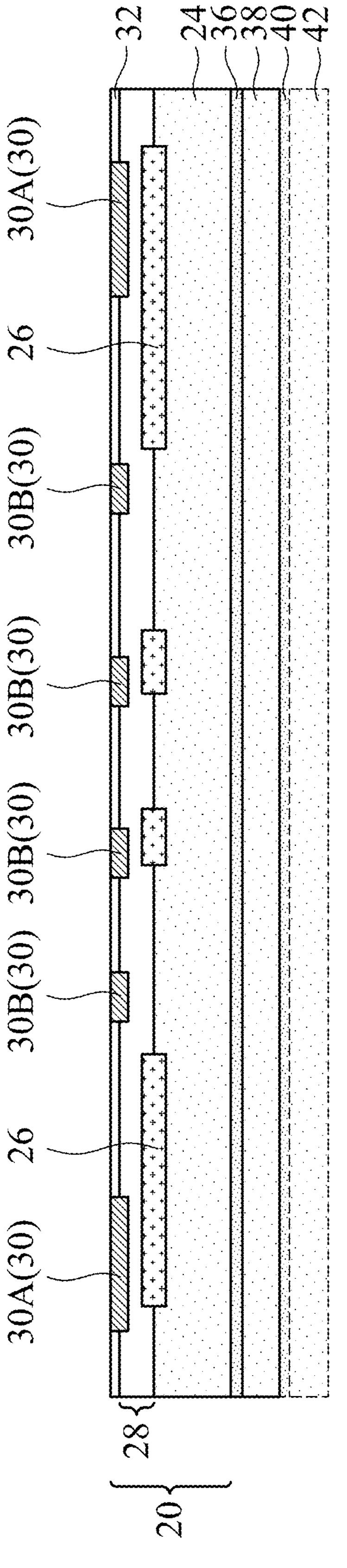

FIG. 3 illustrates the bonding of supporting substrate 42 to supporting substrate 38 in accordance with some embodiments. The respective process is illustrated as process 204 in the process flow 200 as shown in FIG. 26. In accordance with alternative embodiments, the process for bonding supporting substrate 42 is omitted, and supporting substrate 42 does not exist in the resulting MEMS device. Accordingly, supporting substrate 42 and the corresponding bond layer 40 are illustrated using dashed lines to indicate that supporting substrate 42 and the corresponding bond layer 40 may or may not exist. Supporting substrate 42 may be bonded to supporting substrate 38 through bond layer 40. In accordance with some embodiments, bond layer 40 is deposited on supporting substrate 42, and supporting substrate 42 is bonded to supporting substrate 38 through bond layer 40. In accordance with alternative embodiments, bond layer 40 is pre-formed on supporting substrate 42, for example, through thermal oxidation or deposition, and the structure including bond layer 40 and supporting substrate 42 are bonded to supporting substrate 38.

Bond layer 40 may also be a silicon-containing dielectric layer formed of or comprising $SiO_2$, SiN, SiC, SiON, or the like. The deposition process may include LPCVD, PECVD, PVD, ALD, PEALD, or the like. Supporting substrate 42 may be a silicon substrate in accordance with some embodiments, while another type of substrate such as semiconductor substrate, a dielectric substrate, or the like may be used. The bonding of bond layer 40 with supporting substrate 38 and supporting substrate 42 may include fusion bonding.

It is appreciated that supporting substrates 38 and 42 may have thicknesses significantly greater than (for example, two times or more) the thickness of semiconductor substrate 24, while the thicknesses of supporting substrates 38 and 42 and semiconductor substrate 24 are not shown proportionally in FIG. 3. In accordance with some embodiments, the thicknesses of bond layer 40 and supporting substrate 42 may be similar to that of the corresponding bond layer 36 and supporting substrate 38, respectively.

Figure 4:
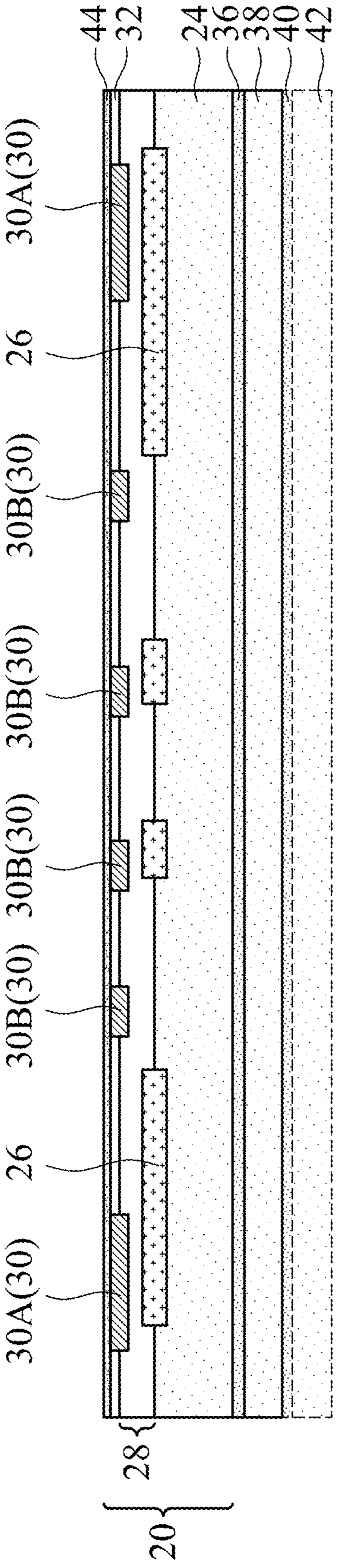

FIG. 4 illustrates the deposition of conductive layer 44, which may be a metal layer, in accordance with some embodiments. The respective process is illustrated as process 206 in the process flow 200 as shown in FIG. 26. Metal layer 44 may be used as an adhesion layer, which has the function of improving the adhesion of the subsequently deposited metal layer 84 (FIG. 15) with the underlying layers. Alternatively stated, metal layer 44 has better adhesion to passivation layer 32 than the adhesion of metal layer 84 to passivation layer 32. Accordingly, metal layer 44 is alternatively referred to as conductive adhesion layer 44. In accordance with alternative embodiments in which metal layer 84 has good adhesion to passivation layer 32, the formation of conductive adhesion layer 44 may be skipped, and metal layer 84 will be in physical contact with the top surface of passivation layer 32. In accordance with some embodiments, metal layer 44 is formed of or comprises titanium, nickel, gold, or the like, or alloy thereof. The deposition process may be performed through PVD, CVD, or the like. Metal layer 44 may be formed as a conformal layer.

Figure 5:
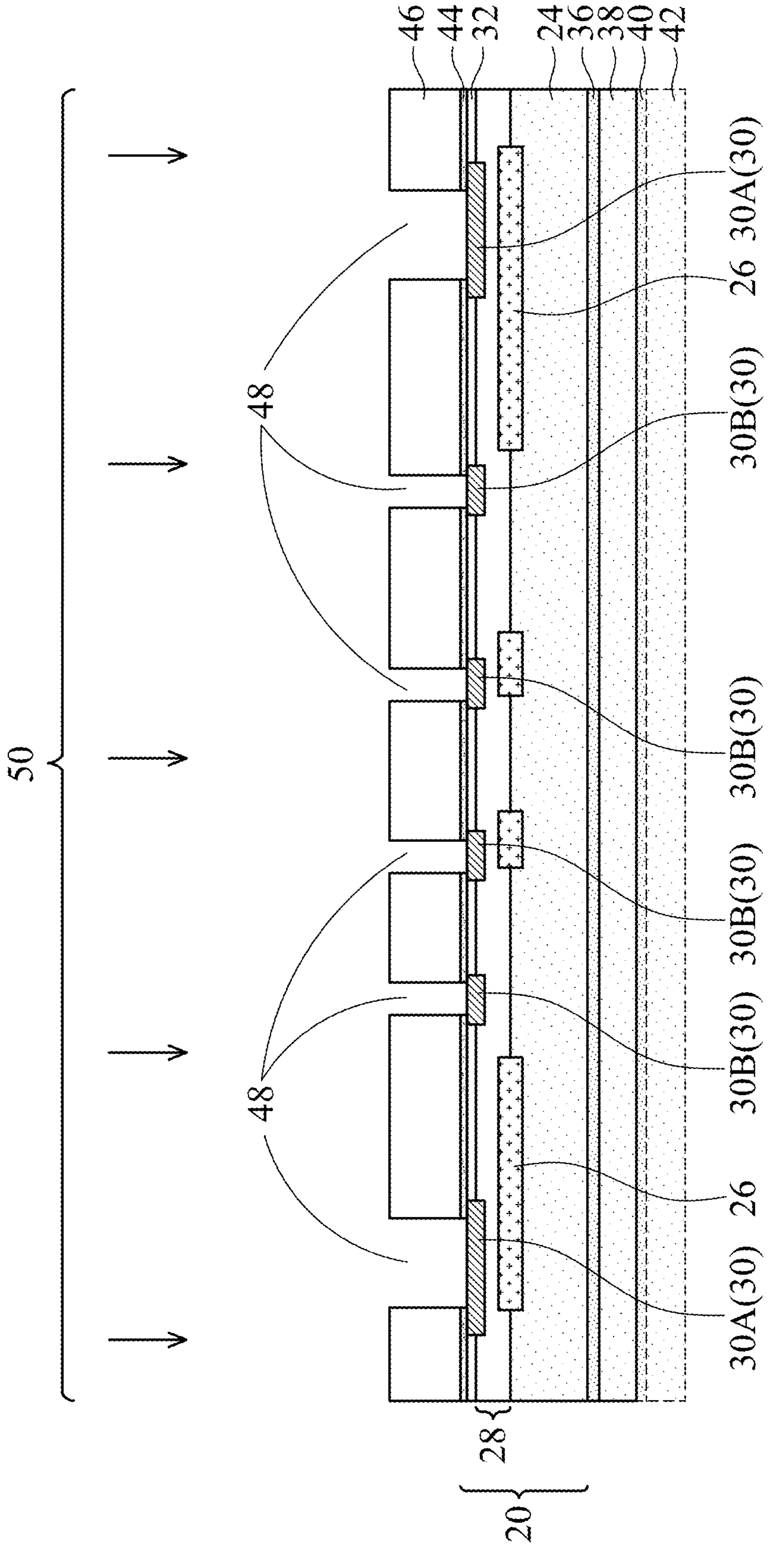

Referring to FIG. 5, etching mask 46 is formed. Etching mask 46 may be a single-layer etching mask comprising a photoresist, a double-layer etching mask comprising a Bottom Anti-Reflective Coating (BARC) and a photoresist over the BARC, or a tri-layer etching mask including a bottom layer (for example, a cross-linked photoresist), a middle layer, and a top layer. Openings 48 are formed in etching mask 46, wherein openings 48 are aligned to metal pads 30.

Next, etching process 50 is performed to etch-through and pattern conductive adhesion layer 44, so that metal pads 30 are revealed. The etching process 50 may use metal pads 30 as an etch stop layer. The respective process is illustrated as process 208 in the process flow 200 as shown in FIG. 26.

Figure 6:
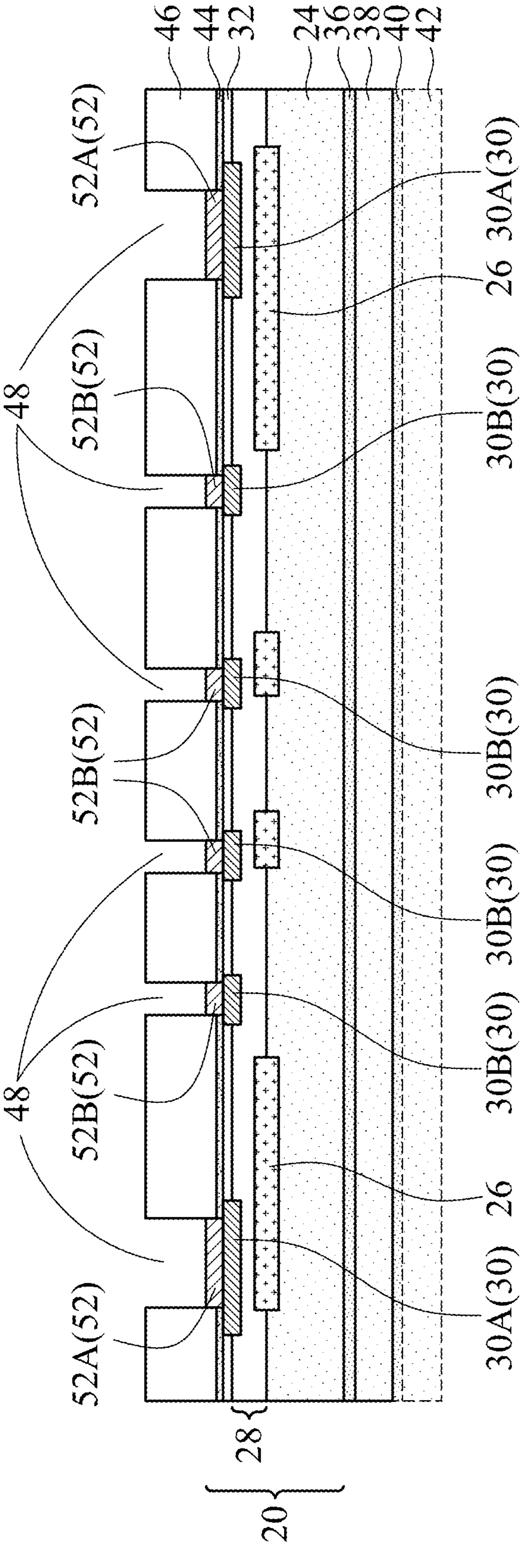

Next, referring to FIG. 6, metal pads 52 are formed. The respective process is illustrated as process 210 in the process flow 200 as shown in FIG. 26. The formation process includes a plating process, which may comprise an electro-chemical plating process, an electro-less plating process, or the like. Metal pads 52 may comprise copper, aluminum, gold, silver, nickel, tungsten, titanium, and/or the like, and combinations thereof. In accordance with some embodiments, as shown in FIG. 6, the plating is performed using etching mask 46 as the plating mask. Accordingly, the edges of metal pads 52 are vertical aligned to, and are in contact with, the edges of conductive adhesion layer 44.

In accordance with alternative embodiments, instead of using etching mask 46 as the plating mask, etching mask 46 is removed, followed by the formation of a plating mask. The plating mask may also comprise a photoresist in accordance with some embodiments. The plating mask is then patterned to form openings, through which metal pads 30 are exposed. The openings in the plating mask may have lateral dimensions greater than the respective dimensions of metal pads 52. Accordingly, some edge portions of conductive adhesion layer 44 may be revealed through the openings in the plating mask. Next, the plating process is performed to deposit a metal, so that metal pads 52 are formed. The respective metal pads 52 thus extend on and cover some edge portions of conductive adhesion layer 44. The plating mask is then removed.

Figure 7:
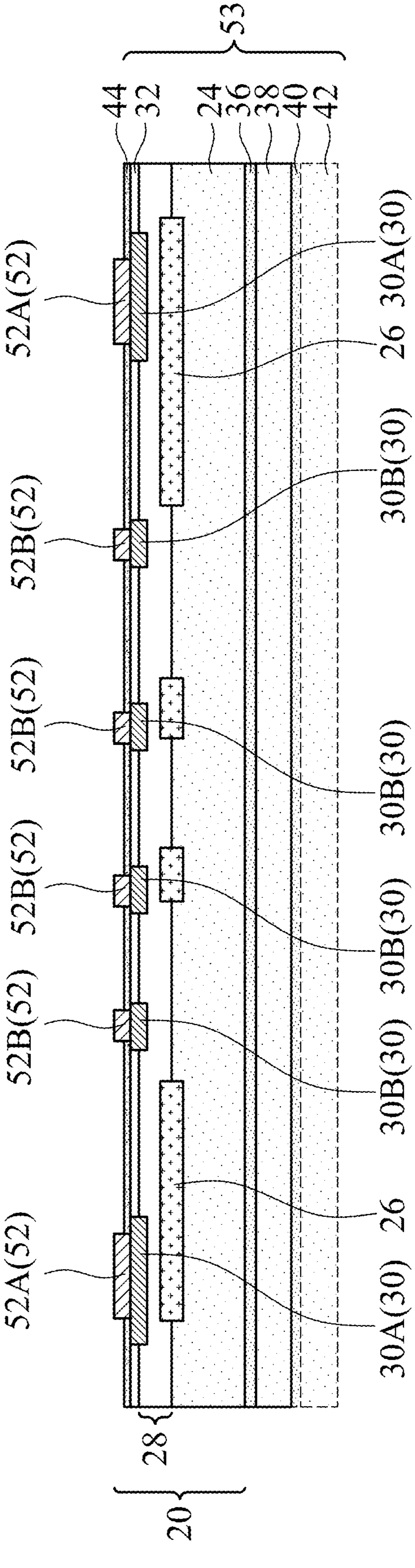

Throughout the description, the structure including wafer 20, bond layer 36, supporting substrate 38, bond layer 40, and supporting substrate 42 are collectively referred to as composite wafer 53, as shown in FIG. 7.

Figure 8:
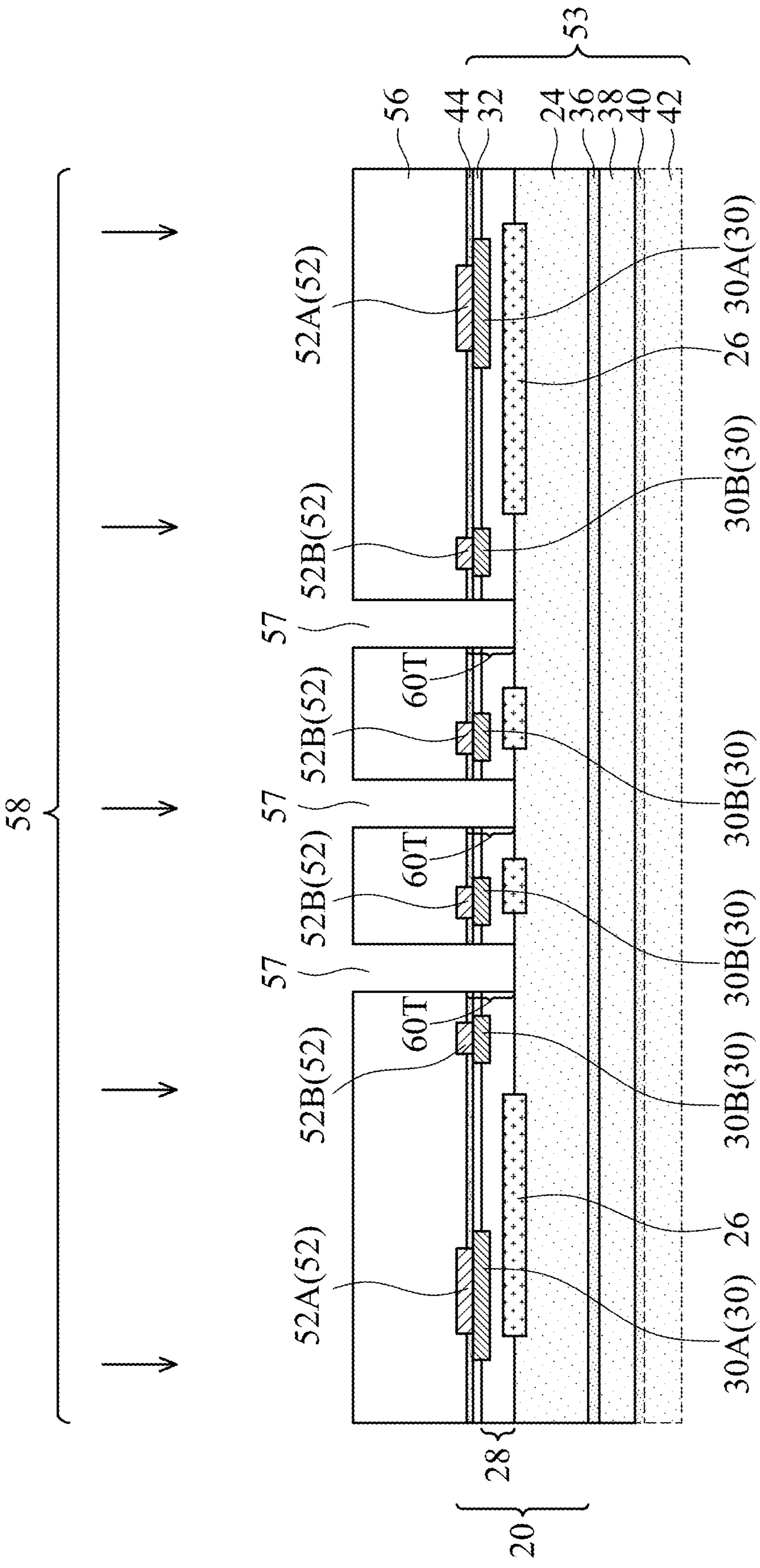

FIG. 8 illustrates an etching process to etch an upper portion of wafer 20. The respective process is illustrated as process 212 in the process flow 200 as shown in FIG. 26. To form openings 60T, etching mask 56 is formed, which may be a single-layer etching mask, a dual-layer etching mask, a tri-layer etching mask, or the like. Openings 57 are formed in etching mask 56, so that conductive adhesion layer 44 is exposed to openings 57. Next, etching processes 58 are performed to etch conductive adhesion layer 44, passivation layer 32, and the dielectric layers in interconnect structure 28. Openings 60T are thus formed in the upper portion of wafer 20. The etching processes may include a plurality of etching process performed using a plurality of different etching chemicals, so that different materials may be etched. The etching processes 58 are mainly anisotropic, while some very thin layers such as etch stop layers may be etched using anisotropic or isotropic etching processes. In accordance with some embodiments, semiconductor substrate 24 is used as an etch stop layer to stop the etching processes 58. The top surface of semiconductor substrate 24 is thus revealed to openings 60T. In accordance with alternative embodiments, a dielectric material, such as a contact etch stop layer, which is underlying the ILD, may be used as an etch stop layer to stop the etching processes 58. After etching processes 58, etching mask 56 is removed.

Figure 9:
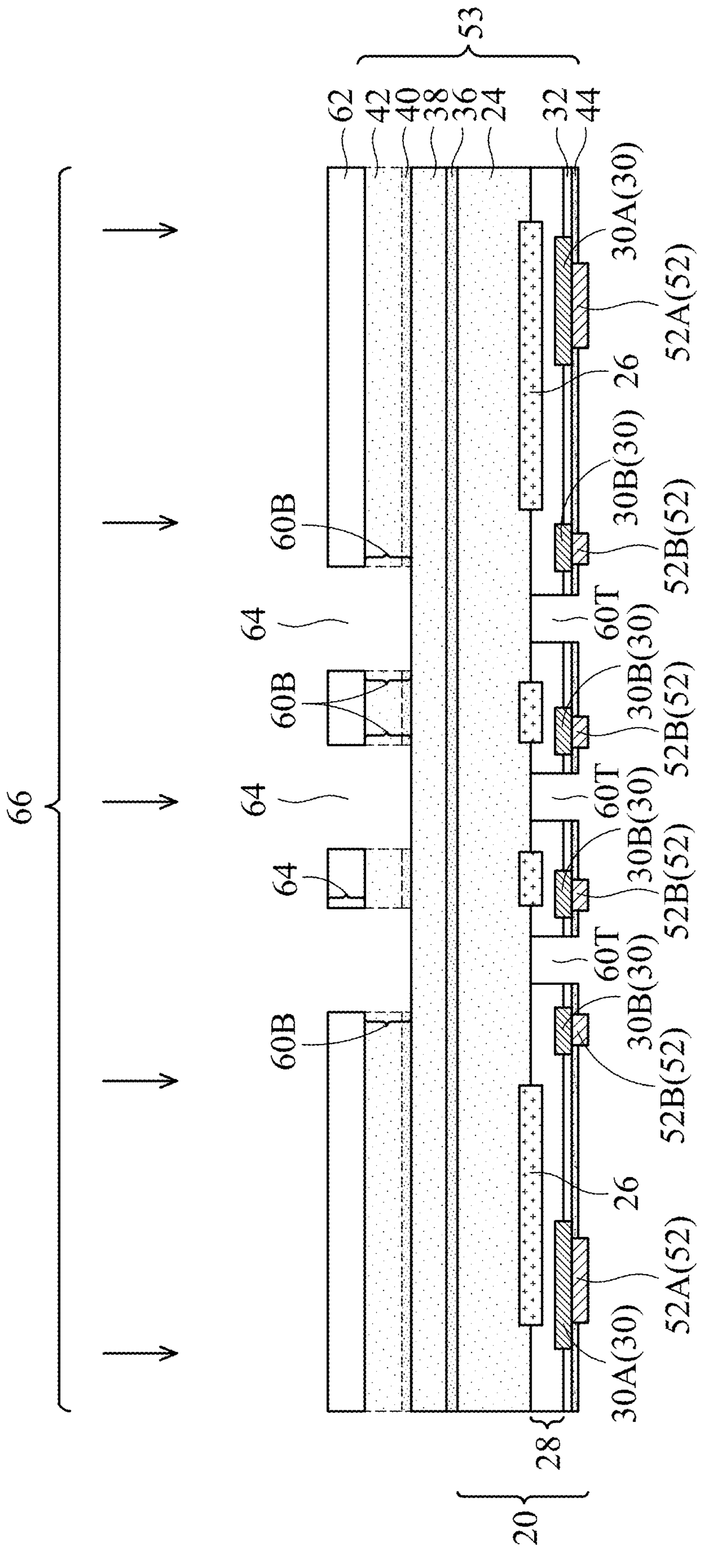

Referring to FIG. 9, composite wafer 53 is flipped upside down. Etching mask 62 is formed on the backside of wafer 20, and on supporting substrate 42. Openings 64 are formed in etching mask 62. Openings 64 are wider than the respective overlying openings 60T, and may laterally extend beyond the edges of openings 60T in all directions. In accordance with some embodiments, etching mask 62 may include a hard mask formed of TiN, TaN, BN, SiN, SiON, SiCN, SiOCN, or the like. The formation of etching mask 62 may include ALD, PECVD, or the like. Etching mask 62 is patterned by using, for example, a patterned photoresist, which is removed after etching mask 62 is patterned.

Etching process 66 is then performed to form openings 60B, which penetrate through supporting substrate 42 and bond layer 40. The respective process is illustrated as process 214 in the process flow 200 as shown in FIG. 26. The etching processes may include Reactive Ion Etching (RIE) processes, in which plasma is generated, and ions are generated from the etching gases. In accordance with some embodiments in which supporting substrate 38 is a silicon substrate, the etching may be performed using process gases selected from, and not limited to, $SF_6$, $CF_4$, $C_4F_8$, $O_2$, Ar, and/or the like, and combinations thereof. The etching of supporting substrate 42 may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts. A bias power in the range between about 50 Watts and about 300 Watts may also be applied.

Etching process 66 may include a Bosch etching process, which is configured to form deep trenches with straight sidewalls. The Bosch etching process includes a plurality of etching cycles. In each of the plurality of etching cycles, openings 60B extend further down and deeper into supporting substrate 42.

In an initial process in etching process 66, shallow openings (which include the top parts of openings 60B) are first formed to extend into supporting substrate 42. A deposition process is then performed to deposit a polymer layer (not shown) extending into the shallow openings. The polymer layer may be deposited using process gases selected from, and not limited to, $CF_4$, $C_4F_8$, and/or the like, and combinations thereof. The polymer layer may comprise carbon, hydrogen, oxygen, and the like. The polymer layer may be formed as a conformal layer.

Next, the polymer layer is patterned in a self-aligned patterning process, which is achieved through an anisotropic etching process. In accordance with some embodiments, the etching is performed using process gases selected from, and not limited to, $SF_6$, $CF_4$, $C_4F_8$, $O_2$, Ar, and/or the like, and combinations thereof. As a result of the self-aligned patterning process, the polymer layer includes sidewall portions on the sidewalls of supporting substrate 42 (and in the shallow openings) to protect the sidewalls, so that the upper portions of opening 60B are not laterally expanded when the opening 60B is extended downwardly in a subsequent etching process.

An etching process is then performed to extend opening 60B deeper into supporting substrate 42. The etching may be performed using process gases selected from, and not limited to, $SF_6$, $CF_4$, $C_4F_8$, $O_2$, Ar, and/or the like, and combinations thereof. The etching is stopped when openings 60B extend down slightly, and the etching is ended before openings 60 extends directly underlying the sidewall portions of the remaining polymer layer, so that openings 60B have straight edges. The bottoms of openings 60B may also be planar.

In accordance with some embodiments, the etching of supporting substrate 42 includes a plurality of deposition-etching cycles, each including a polymer-deposition process (as discussed above), a self-aligned patterning process (as discussed above), and an etching process to extend openings 60B down. The polymer layer formed in the previous cycle may be removed or may be left for the next cycle. Each of the deposition-etching cycles results in openings 60B to extend further down, until supporting substrate 42 is etched-through, and openings 60B extend to bond layer 40, which acts as an etch stop layer. After the last etching process, no more polymer layer is deposited.

Bond layer 40 is then etched. The etching may be isotropic or anisotropic, and may be performed through a wet etching process or a dry etching process. The previously formed polymer layer may be removed after bond layer 40 is exposed but not etched-through, or removed after bond layer 40 is etched-through. After the etching process 66, etching mask 62 is removed.

Figure 10:
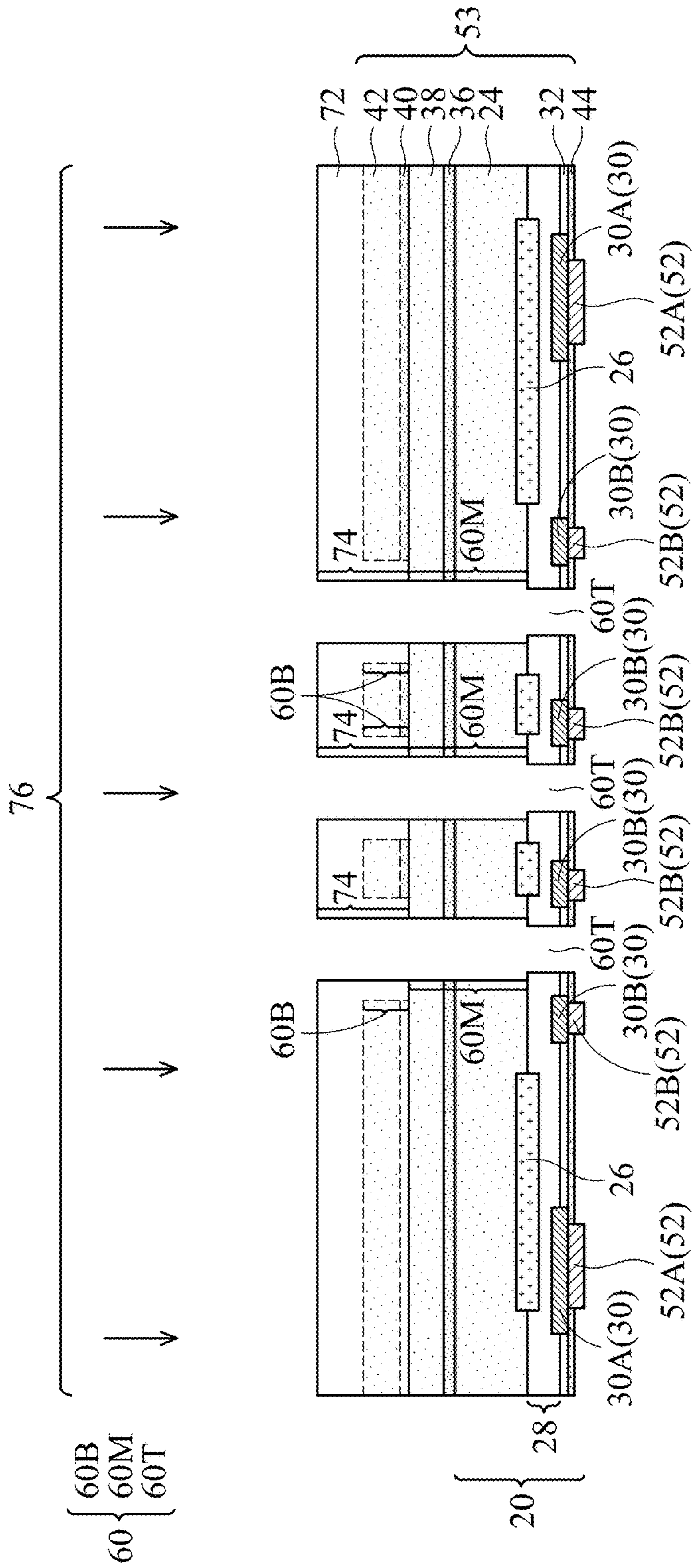

FIG. 10 illustrates another etching process to etch-through supporting substrate 38, bond layer 36, and semiconductor substrate 24. The respective process is illustrated as process 216 in the process flow 200 as shown in FIG. 26. Etching mask 72 is formed on the backside of wafer 20, and on supporting substrate 38. Openings 74 are formed in etching mask 72. Openings 74 are wider than the respective underlying openings 60T and narrower than the respective overlying openings 60B. Openings 74 may laterally extend beyond the edges of openings 60T in all lateral directions, and laterally recessed from the edges of openings 60B in all directions. In accordance with some embodiments, etching mask 72 may include a hard mask formed of TiN, TaN, BN, SiN, SiON, SiCN, SiOCN, or the like. The formation process may include ALD, PECVD, or the like. Etching mask 72 may be patterned by using a patterned photoresist, which is removed after etching mask 72 is patterned.

Next, as also shown in FIG. 10, etching process 76 is performed to etch-through supporting substrate 38, bond layer 36, semiconductor substrate 24, and any dielectric layer that are not etched when openings 60T are formed. Openings 60M are thus formed to penetrate through supporting substrate 38, bond layer 36, and semiconductor substrate 24. Etching process 76 may include a Bosch etching process. The details of etching process 76 may be the same as that of etching process 66, and are not repeated herein.

Figure 11:
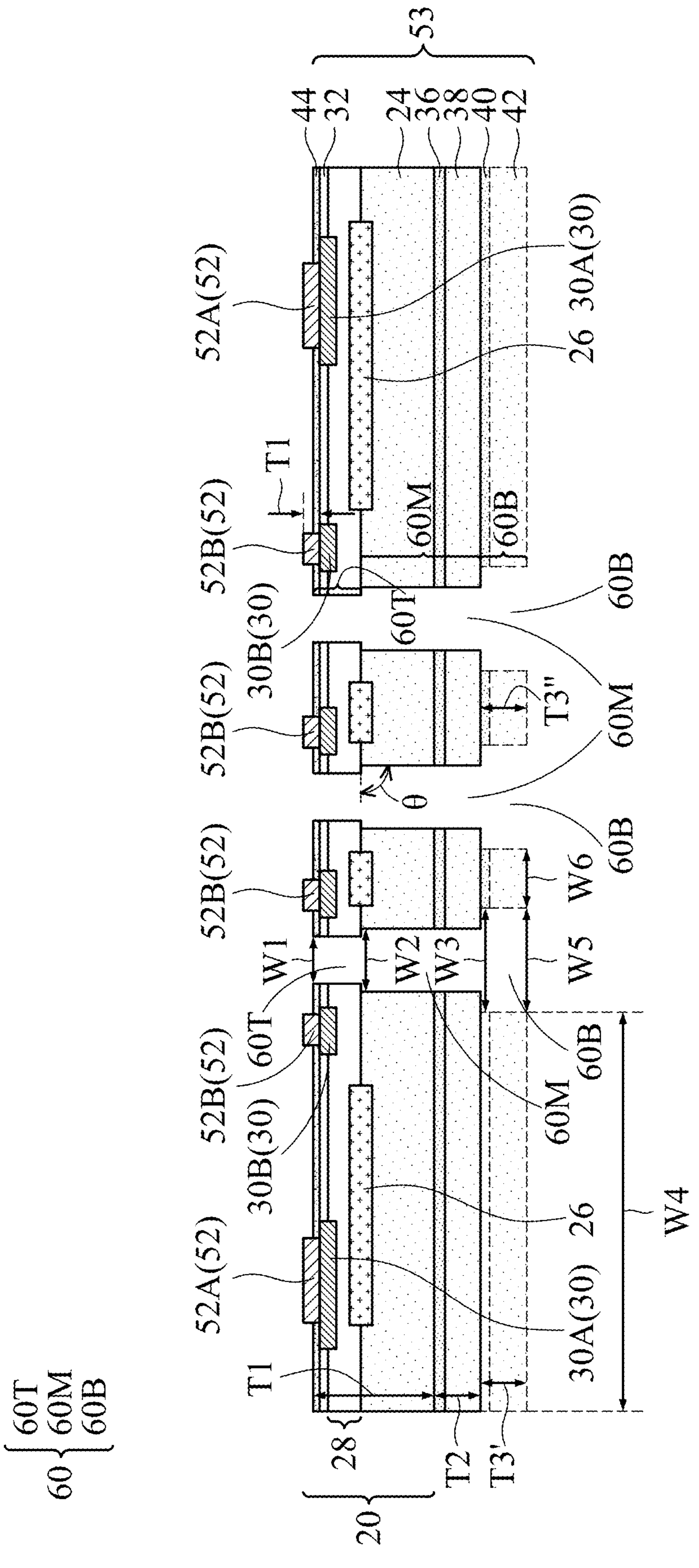
Figure 21:
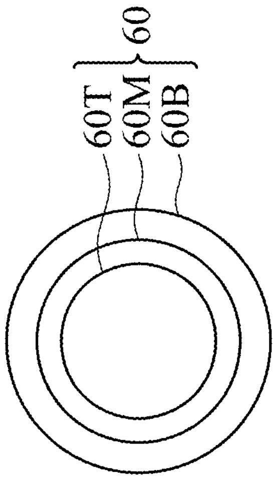
FIG. 21 illustrates a top view of a metal pad isolated from surface metal layers in accordance with some embodiments.

Throughout the description, openings 60T, 60M, and 60B are collectively referred to as through-holes 60. Openings 60T, 60M, and 60B indicate that these openings are the top portions, middle portions, and bottom portions, respectively, of through-holes 60, when composite wafer 53 is oriented in the orientation as shown in FIG. 11. FIG. 21 illustrates a bottom view of an example through-hole 60. After through-holes 60 are formed, etching mask 72 is removed.

Figure 14:
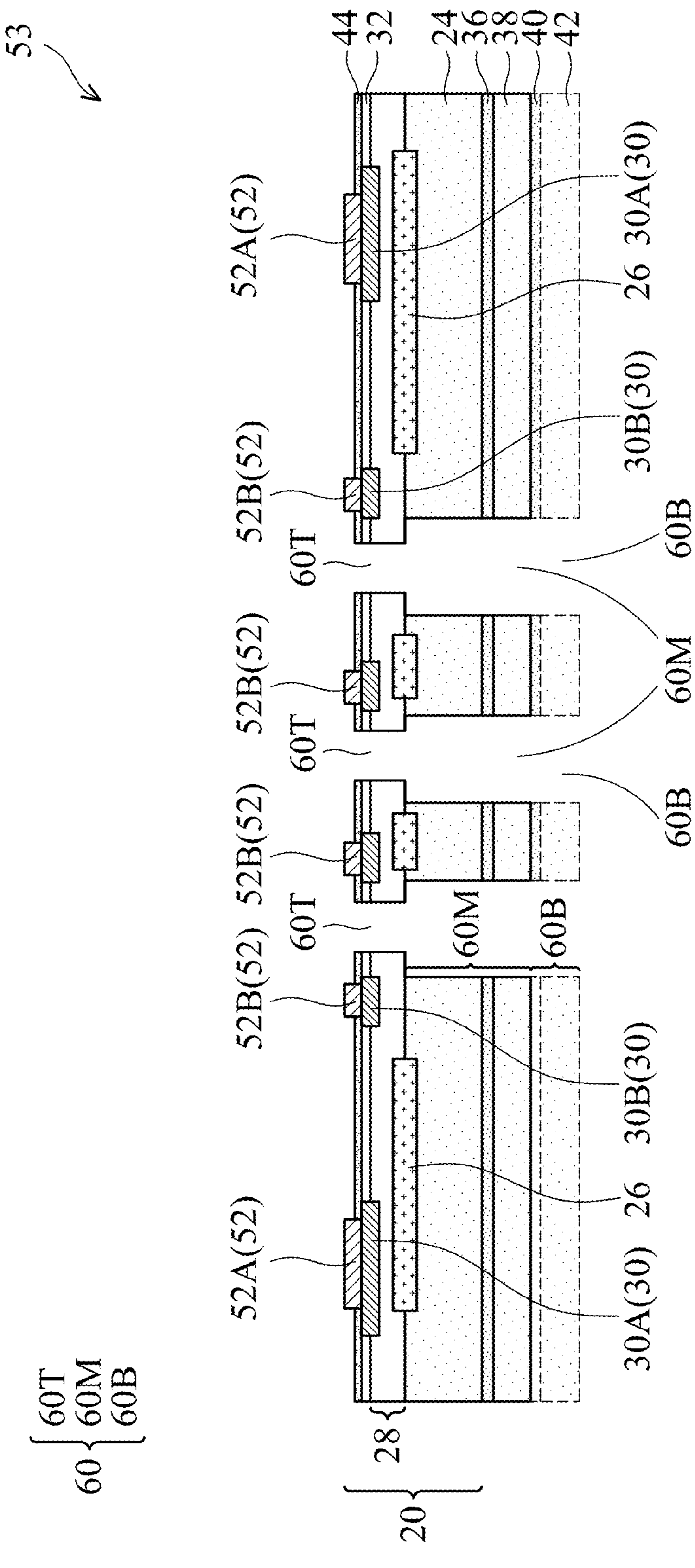

In accordance with alternative embodiments, instead of performing both of etching process 66 (FIG. 9) and etching process 76 (FIG. 10), the etching process 66 as shown in FIG. 9 may be continued to etch supporting substrate 38, bond layer 36, and semiconductor substrate 24. Accordingly, openings 60M and 60B are formed using the same etching mask, and each of openings 60M may have the same lateral dimension as the respective overlying openings 60B. The resulting composite wafer 53 is shown in FIG. 14.

FIG. 11 illustrates the structure after the formation of through-holes 60, wherein the structure is flipped upside down from the structure shown in FIG. 10. In accordance with some embodiments, the lateral dimension W1 of top openings 60T may be in the range between about 3 μm and about 15 μm. The lateral dimension W2 of middle openings 60M is greater than lateral dimension W1, and may be in the range between about 10 μm and about 30 μm. The lateral dimension W3 of openings 60B is greater than or equal to lateral dimension W2, and may be in the range between about 20 μm and about m. Lateral dimensions W1, W2, and W3 are the top dimensions of openings 60T, 60M, and 60B, respectively.

In accordance with some embodiments, the thickness T1 of wafer 20 may be in the range between about 5 μm and about 12 μm. The combined thickness T2 of supporting substrate 38 and bond layer 36 may be in the range between about 25 μm and about 50 μm. Different portions of supporting substrate 42 and bond layer 40 may have different thicknesses. For example, the thickness T3' (of supporting substrate 42 and bond layer 40) may be in the range between about 50 μm and about 800 am. The thickness T3" (of supporting substrate 42 and bond layer 40) may be in the range between about 0 μm and about 770 μm (with 0 μm indicating not supporting substrate 42 is formed, or these portions of supporting substrate 42 is fully consumed). It is noted that the thickness of wafer 20 is exaggerated to show the details therein. Also, supporting substrate 42 may also be thicker than supporting substrate 38 in accordance with some embodiments. Tilt angle θ, which is formed between the sidewall of semiconductor substrate 24 and the top surface of semiconductor substrate 24, may be equal to or greater than 90 degrees. Angle θ may be in the range between about 90 degrees and about 105 degrees in accordance with some embodiments.

In accordance with some embodiments, the lateral distance between the edge of the respective chip 22 to the nearest through-hole 60 is represented as dimension W4. The bottom width of through-hole 60, which is also the bottom width of opening 60B, is represented as dimension W5. The lateral distance between neighboring through-holes 60 is represented as dimension W6. In accordance with some embodiments, lateral dimension W4 may be in the range between about 2,000 μm and about 8,000 μm. Lateral dimension W5 is equal to or greater than lateral dimension W3, and may be in the range between about 10 μm and about 30 μm. The lateral spacing W6 may be in the range between about 3 μm and about 50 μm. The lateral dimension W7 of metal pads 30B may be in the range between about 2 μm and about 10 μm. The thickness T4 of metal pads 30B may be in the range between about 5 μm and about 70 μm.

Figure 12:
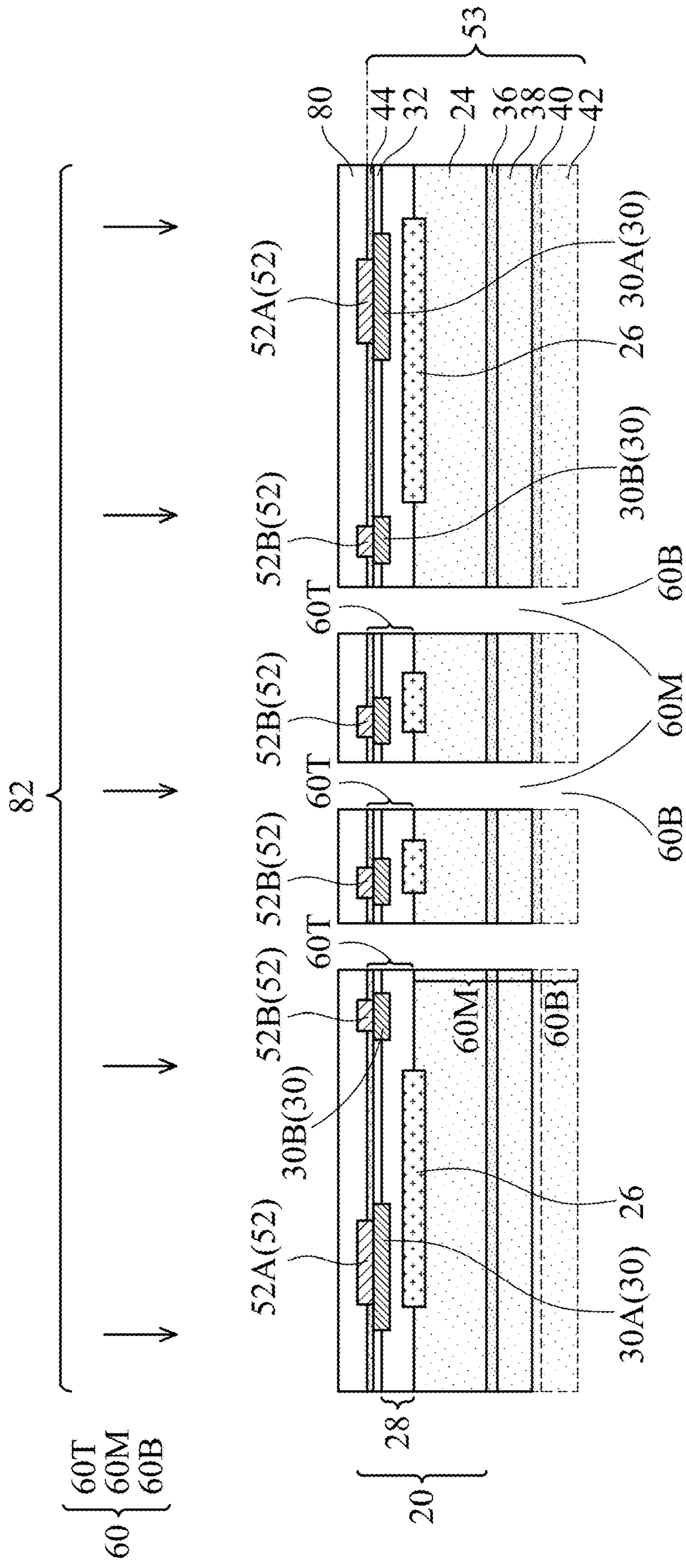
Figure 13:
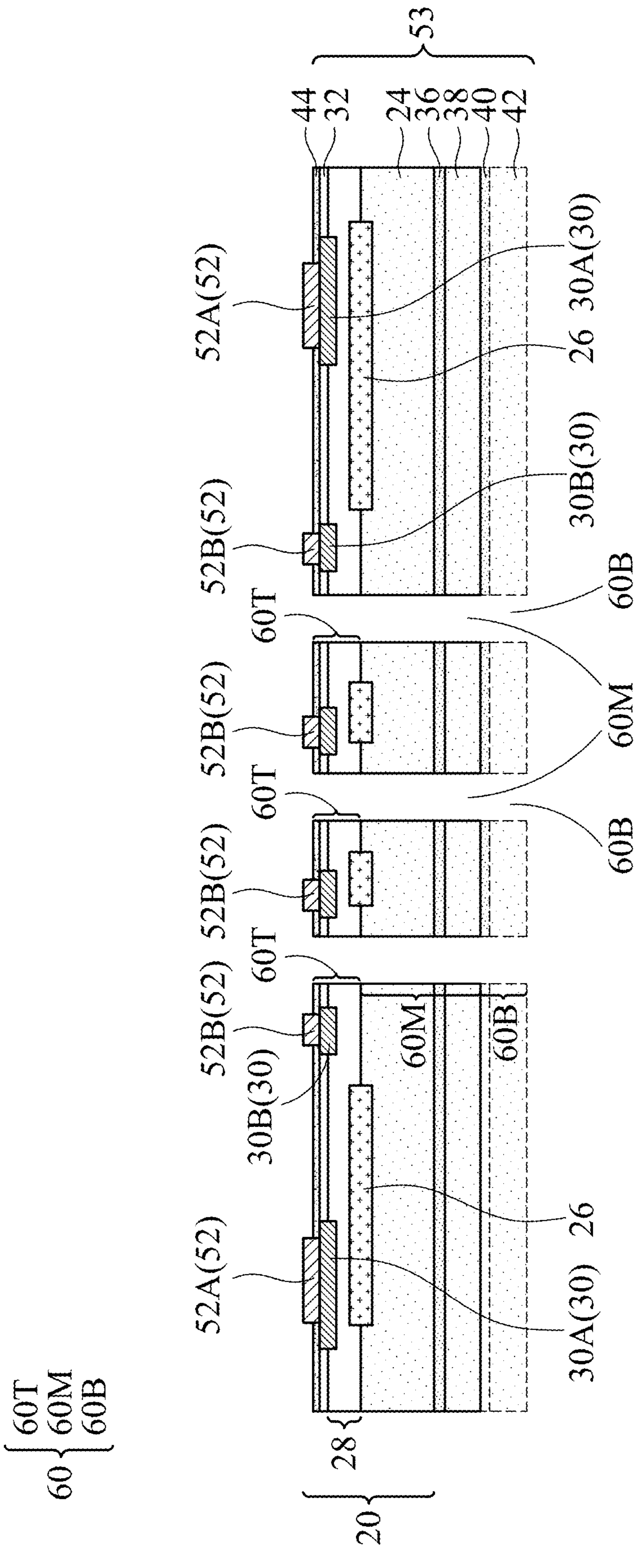

FIGS. 12-14 illustrate the formation of through-holes 60 in accordance with alternative embodiments. Referring to FIG. 12, etching mask 80 is formed, and is used to etch composite wafer 53 through etching process 82. In accordance with some embodiments, etching process 82 includes a Bosch etching process, and composite wafer 53 is etched-through to form through-holes 60. Through-holes 60 may have straight edges, which may be vertical or tilted. Etching process 82 may include Bosch etching processes. The details of etching process 82 may be appreciated from the above discussion, and are not repeated herein. After etching process 82 is performed, etching mask 80 is removed, and the resulting composite wafer 53 is shown in FIG. 13.

Referring to FIG. 14, an isotropic etching process, which may be a wet etching process or a dry etching process, is performed. The etching chemical is selected to expand the lower portions of through-holes 60 in bond layer 36, supporting substrate 38, bond layer 40, and supporting substrate 42. Accordingly, openings 60M and 60B are laterally expanded, while openings 60T are not laterally expanded. In accordance with these embodiments, the edges of openings 60M and 60B may be substantially continuous, and may be vertical or tilted. There is an abrupt change, however, between the top dimensions of openings 60M and the bottom dimensions of openings 60T.

Figure 15:
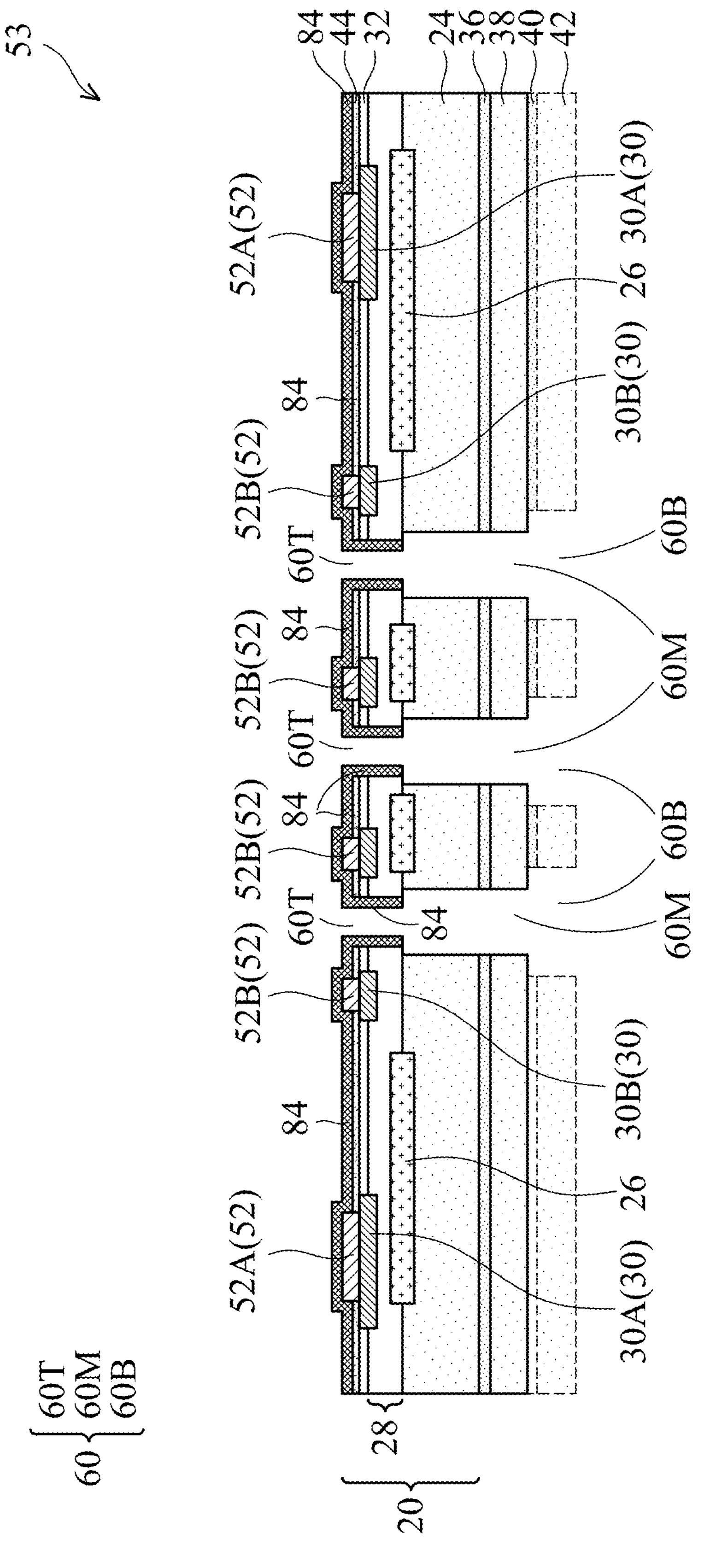

Referring to FIG. 15, metal layer 84 is deposited. The respective process is illustrated as process 218 in the process flow 200 as shown in FIG. 26. In accordance with some embodiments, the formation of metal layer 84 includes depositing a metal seed layer, and then plating a metallic material on the metal seed layer. The metal seed layer may comprise a titanium layer and a copper layer on the titanium layer. Alternatively, the metal seed layer may comprise a copper layer (without the titanium layer). The plated material may comprise copper, aluminum, nickel, gold, silver, or the like, or alloys thereof. The deposition of the metal seed layer may be performed, for example, through PVD from the front side (the illustrated top side) of wafer 20 in accordance with some embodiments.

The metal seed layer extends on the top surface and the sidewalls of wafer 20, wherein the sidewalls are inside and face openings 60T. In the plating process, the plated metallic material is deposited on the metal seed layer, and not on the surfaces of composite wafer 53 that do not have the metal seed layer thereon. The plated metallic material is thus also deposited on the top surface of wafer 20, and extend into openings 60T.

The bottom ends of metal layer 84 may be at substantially the same level as where interconnect structure 28 joins semiconductor substrate 24. Since the sidewalls of semiconductor substrate 24, supporting substrates 38 and 42, and bond layers 36 and 40 that face openings 60M and 60B are recessed laterally from the sidewalls of interconnect structure 28, no metal seed layer is formed in openings 60M and 60B. As a result, the plated metallic material is also not deposited into openings 60M and 60B, and hence metal layer 84 does not extend into openings 60M and 60B.

Figure 16:
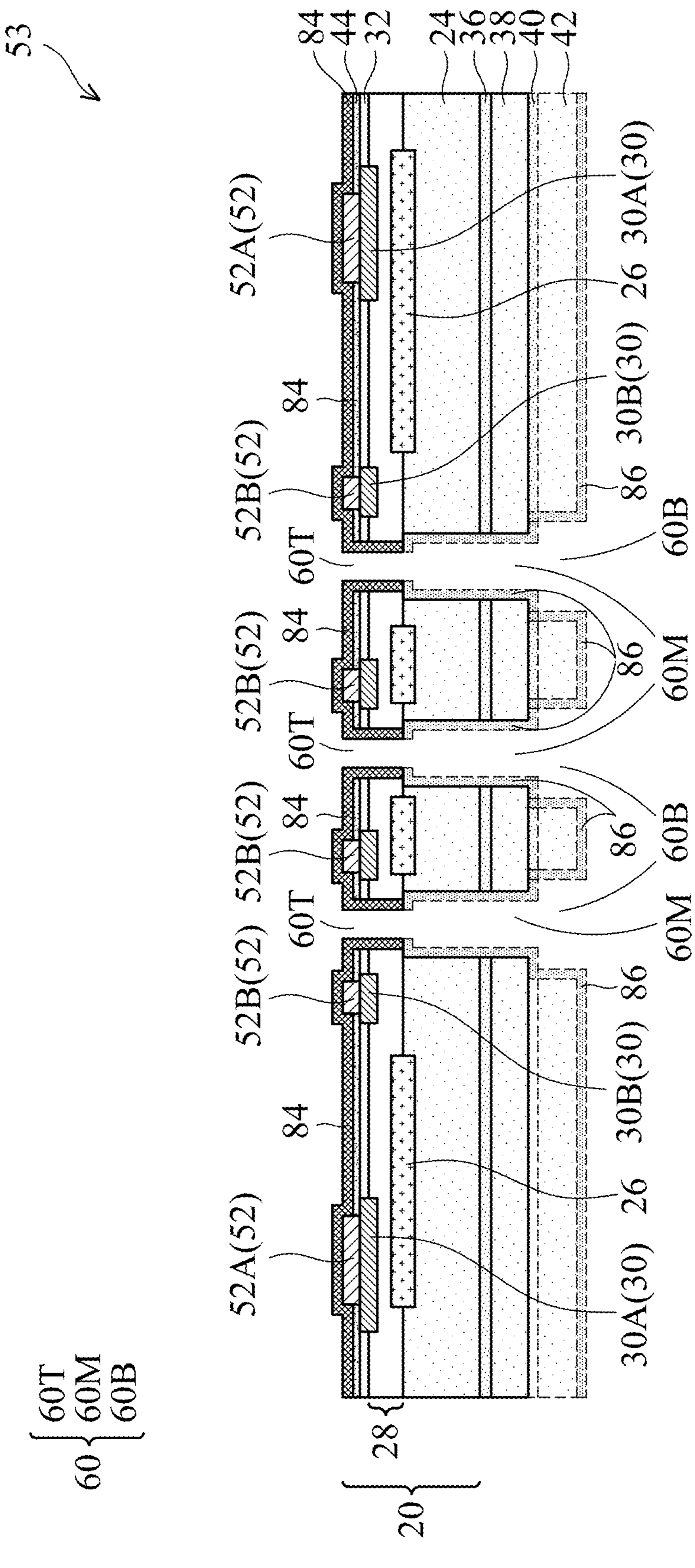
Figure 20:
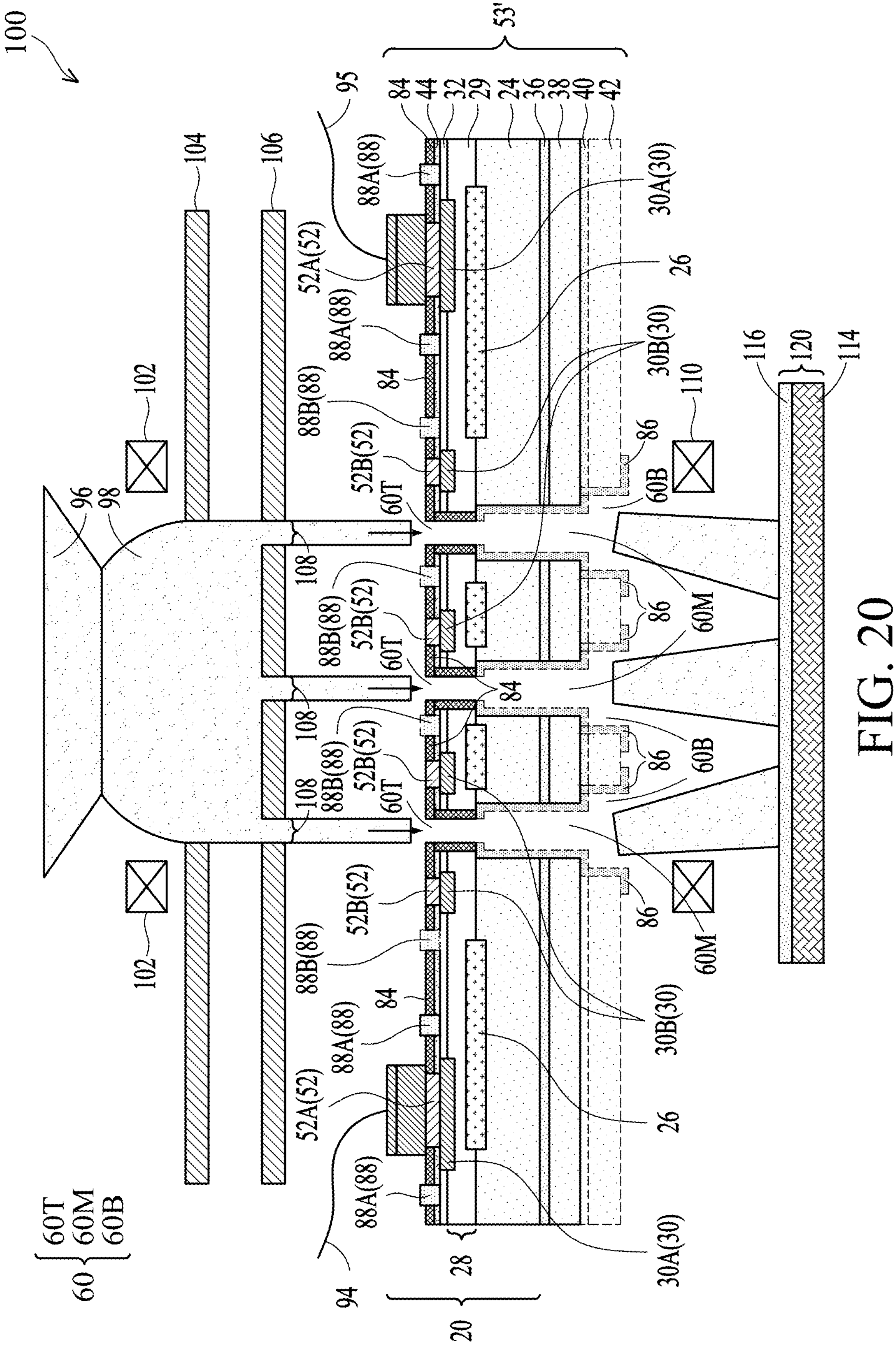
FIG. 20 illustrates the usage of a MEMS device in accordance with some embodiments.

FIG. 16 illustrates the formation of metal layer 86 in accordance with some embodiments. The respective process is illustrated as process 220 in the process flow 200 as shown in FIG. 26. In accordance with other embodiments, metal layer 86 is not formed, and does not exist in the final MEMS device 53' (FIGS. 19 and 20). Accordingly, metal layer 86 is shown as being dashed to indicate that it may or may not be formed. The formation of metal layer 86 may also include depositing a metal seed layer, and plating a metallic material on the metal seed layer. The deposition of the metal seed layer may be performed through PVD from the backside (the illustrated bottom side) of composite wafer 53 in accordance with some embodiments. The materials of the metal seed layer and the plated metallic material may be selected from the same groups of candidate materials for forming the metal seed layer and the plated metallic material, respectively, of metal layer 84. Metal layer 86 may have horizontal portions contacting the bottom surfaces of semiconductor substrate 24 and supporting substrates 38 and 42.

In accordance with alternative embodiments, the sequence for forming metal layers 84 and 86 is inversed, with metal layer 86 being formed before the formation of metal layer 84.

In accordance with some embodiments, metal layers 84 and 86 are distinguishable from each other. This may be due to that metal layers 84 and 86 are formed in separate processes. Furthermore, the materials of metal layers 84 and 86 may be different from (or the same as) each other. In addition, some parts of the metal seed layer in metal layer 86 may be formed on (and covering) the end portions of the plated material of metal layer 84. Alternatively, some parts of the metal seed layer in metal layer 84 may be formed on (and covering) the end portions of plated material of metal layer 86, depending on which of metal layers 84 and 86 is formed first.

It is appreciated that when forming the metal seed layer for metal layer 84, since openings 60T are shallow, the corresponding metal seed layer has a good coverage on the formed regions, and has high quality. The metal seed layer is thus unlikely to peel from the surfaces on which it is formed. As a comparison, if through-holes 60 do not have widened lower parts, the metal seed layer of metal layer 84 may extend on the surfaces of semiconductor substrate 24, bond layer 36, supporting substrate 38, bond layer 40, and supporting substrate 42 (if formed). Since the un-widened through-holes 60 have very high aspect ratio, the parts of the metal seed layer formed at the bottom portions of through-holes 60 have low quality. These parts of the metal seed layer and the metallic material deposited thereon thus may peel off, and may block the corresponding through-holes 60. The paths of the charged particles are thus blocked, as can be appreciated from FIG. 20.

Furthermore, although metal layer 86 may be formed, since the metal seed layer of metal layer 86 is deposited from the backside of composite wafer 53, and the entrance of through-holes 60 are widened from the backside, the quality of the metal seed layer of metal layer 86 is also improved. Metal layer 86 is thus less likely to peel off.

Figure 17:
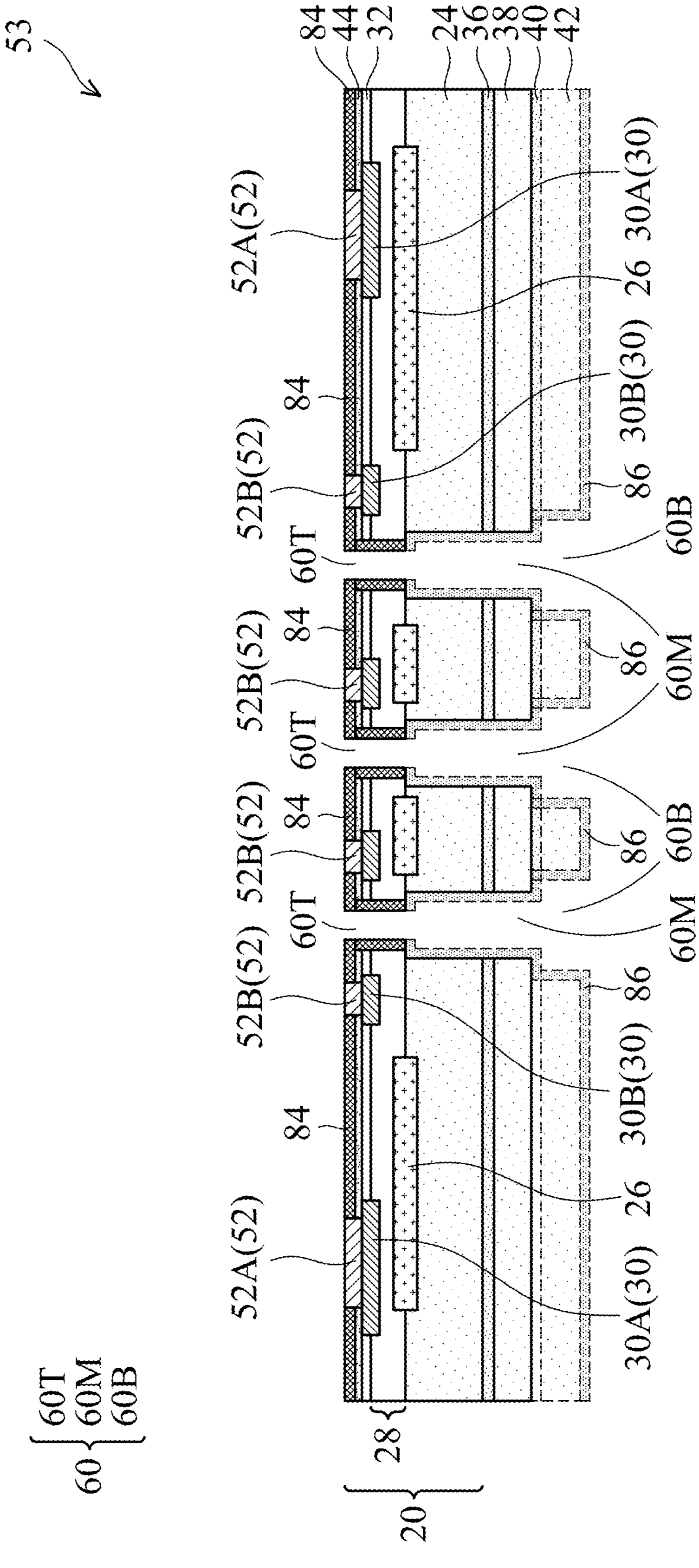

FIG. 17 illustrates a process for revealing metal pads 52. In accordance with some embodiments, the revealing process is performed through a planarization process such as a CMP process or a mechanical grinding process. The respective process is illustrated as process 222 in the process flow 200 as shown in FIG. 26. In accordance with alternative embodiments, the process shown in FIG. 17 is skipped, and metal pads 52 remain to be covered by metal layer 84 in the final MEMS device.

Figure 18:
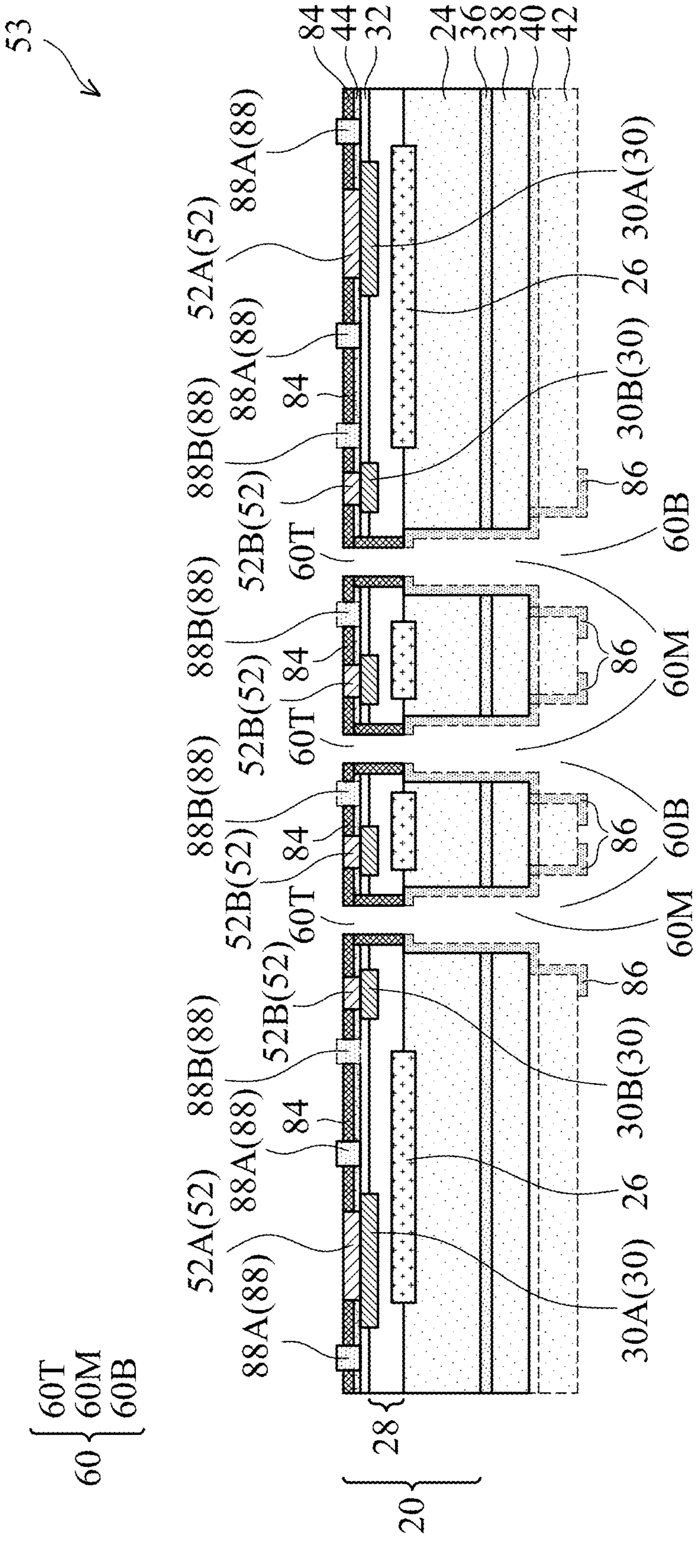

FIG. 18 illustrates the formation of dielectric isolation regions 88 (including 88A and 88B) to electrically insulate some of metal pads 30 and 52 from other conductive features. The respective process is illustrated as process 224 in the process flow 200 as shown in FIG. 26. The insulated metal pads 52 include metal pads 30A and 52A, and may or may not include some of metal pads 30B and 52B. For example, metal layer 84 and conductive adhesion layer 44 may be etched-through, so that each of metal pads 52A and the portions of metal layer 84 and conductive adhesion layer 44 surrounding metal pads 52A are physically and electrically isolated from the rest of metal layer 84 and conductive adhesion layer 44.

Figure 22:
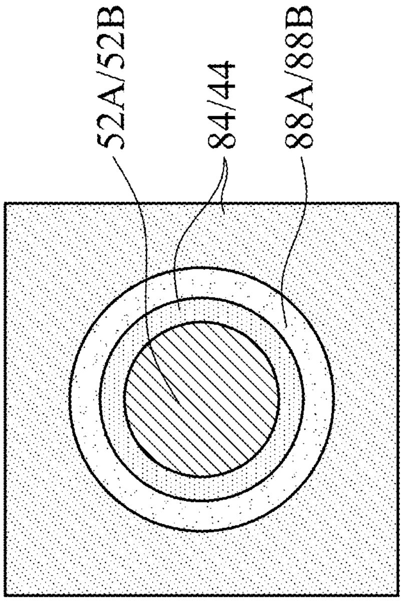
FIG. 22 illustrates a top view of a through-hole in accordance with some embodiments.

In accordance with some embodiments, dielectric isolation regions 88A are formed extending into the trenches left by the etching of metal layer 84 and conductive adhesion layer 44. FIG. 22 illustrates an example top view of one of metal pads 52A and 52B (referred to as 52A/52B) and its surrounding dielectric isolation region 88A or 88B. Metal pads 52 are electrically connected to integrated circuit devices 26. Dielectric isolation regions 88 may also be formed of air gaps (not filled), silicon oxide, silicon nitride, silicon carbide, and/or the like.

Figure 24:
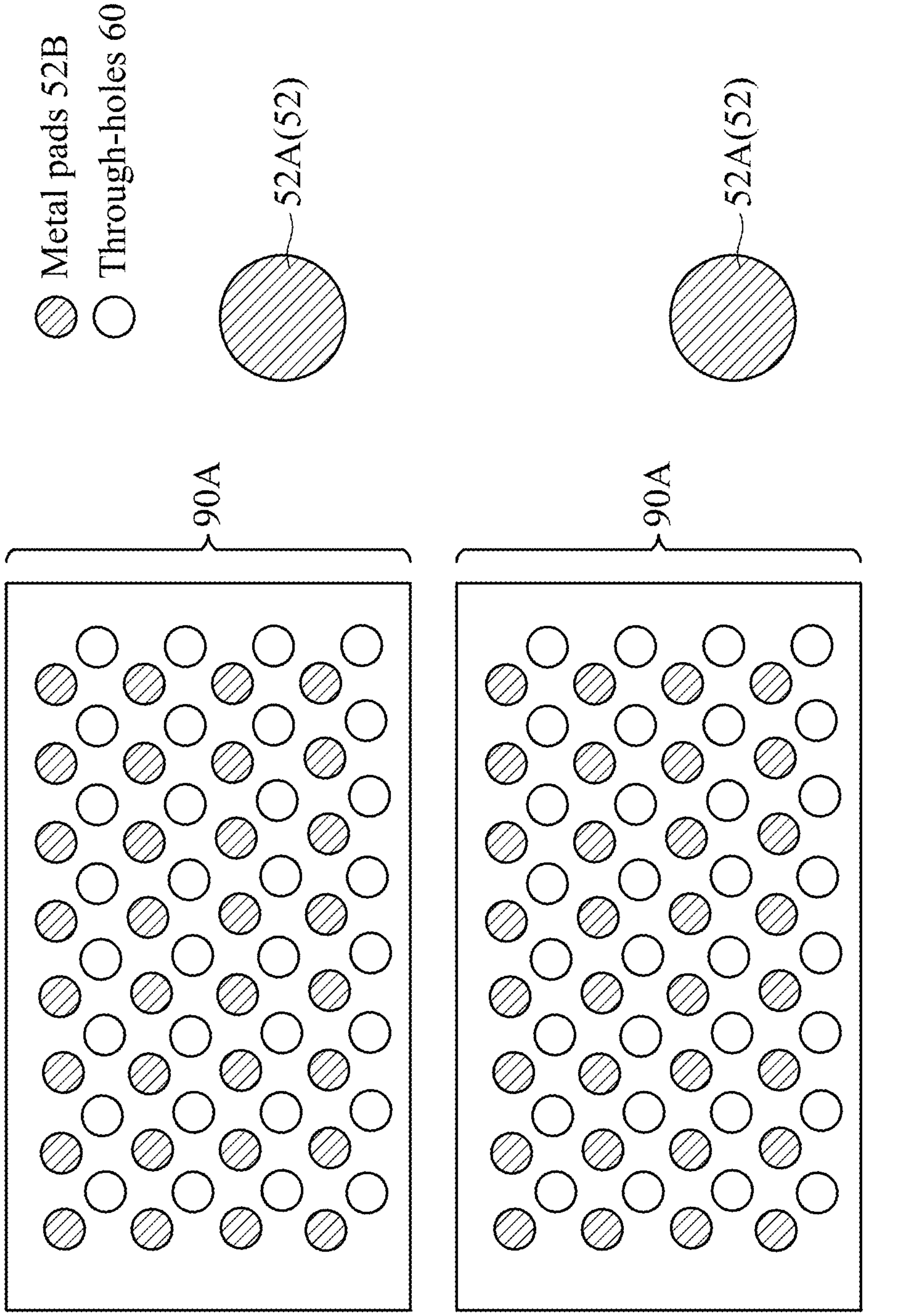
FIG. 24 illustrates a top view of a plurality of metal pads and through-holes in accordance with some embodiments.

The portions of metal layer 84 extending into multiple through-holes 60 may be electrically shorted together by other portions of metal layer 84 and conductive adhesion layer 44. A plurality of metal pads 52B thus may be electrically shorted. Metal pads 52B are also electrically connected to integrated circuit devices 26, and a plurality of metal pads 52B may receive a same voltage from integrated circuit devices 26. Providing a plurality of metal pads 52B (although they are electrically shorted) may reduce the resistance in the paths for providing voltages to different parts of metal layer 84. FIG. 24 schematically illustrates a top view of a plurality of regions 90A, each including a plurality of through-holes 60, with the metal layer 84 extending into the plurality of through-holes 60 being electrically interconnected.

The portions of metal layer 84 extending into multiple through-holes 60 may also be electrically insulated from each other by dielectric insulation regions 88B, which are also comprised in dielectric insulation regions 88. The corresponding metal pads 52B aside of these through-holes 60 are thus electrically insulated from each other. The corresponding metal pads 52B are connected to integrated circuit devices 26, and may receive voltages that may be different from each other, or the same as each other.

Figure 25:
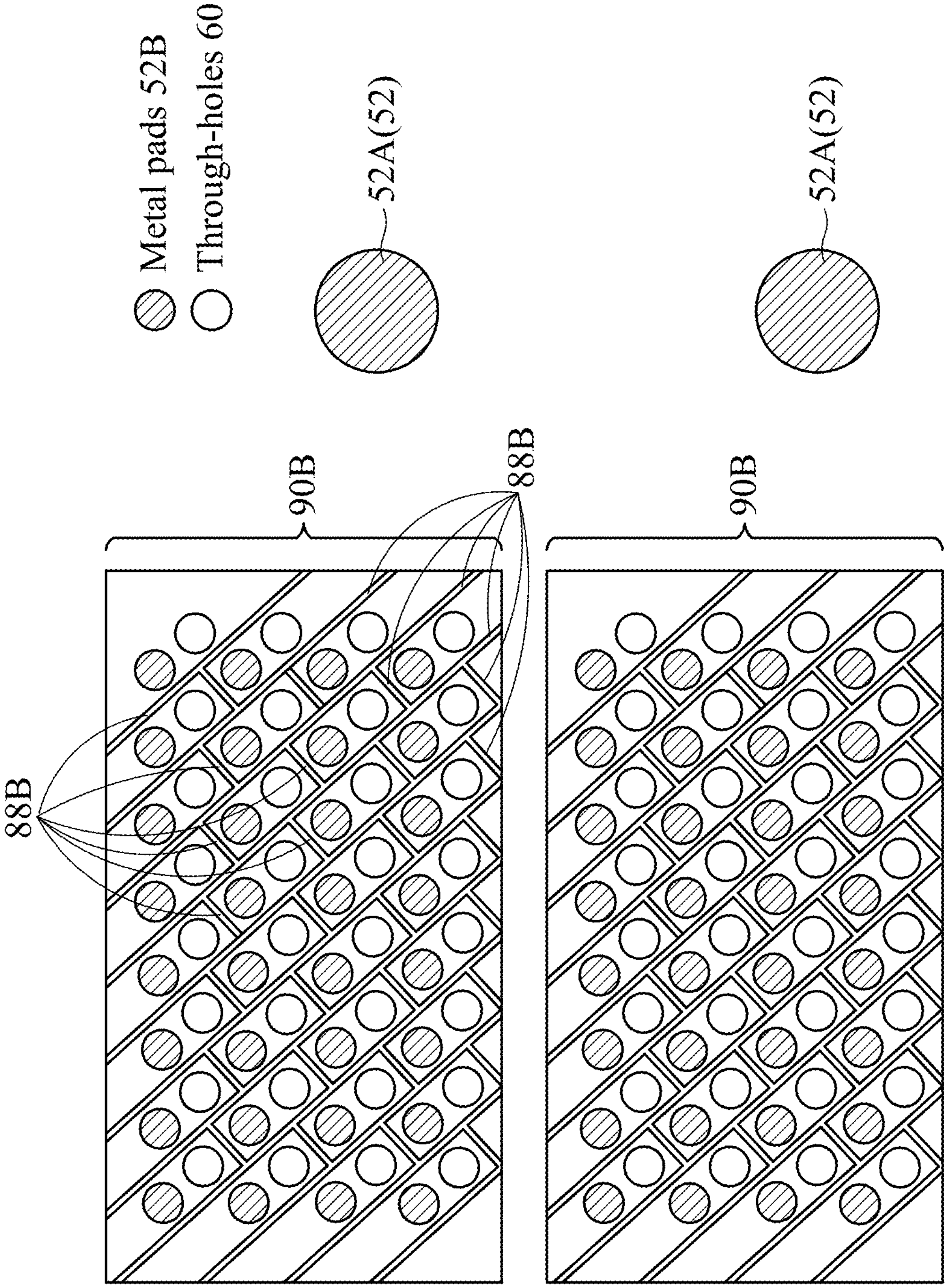
FIG. 25 illustrates a top view of a plurality of metal pads and through-holes, with a surface metal layer being patterned in accordance with some embodiments.

FIG. 25 schematically illustrates a top view of a plurality of regions 90B, each including a plurality of through-holes 60, with the metal layer 84 extending into the plurality of through-holes 60 being electrically insulated from each other by dielectric isolation regions 88B. The portions of metal layer 84 extending into each through-hole 60 is electrically connected to a nearest metal pad 52B in order to receive a voltage.

It is appreciated that a device chip 22 (a MEMS device) may include the devices shown in either one or both of FIGS. 24 and 25. For example, a device chip 22 may include a plurality of regions 90A (FIG. 24) and also a plurality of regions 90B (FIG. 25). Alternatively, device chip 22 may include a single one or a plurality of regions 90A or a single one or plurality of regions 90B, but not both of device regions 90A and 90B.

In accordance with some embodiments, metal layer 86 are also be patterned, so that the portions of metal layer 86 extending into different through-holes 60 are electrically insulated from each other. In accordance with alternative embodiments, metal layer 86 is not patterned, so that the portions of metal layer 86 extending into different through-holes 60 are electrically shorted.

FIG. 19 illustrates the formation of electrical connectors 92, which may be Under-Bump-Metallurgies (UBMs), metal pads, metal pillars, and/or the like. The respective process is illustrated as process 226 in the process flow 200 as shown in FIG. 26. Electrical connectors 92 may be used for providing power such as VDD and electrical ground into chips 22. Electrical connectors 92 may be connected to bond wires (not shown) to provide power connection and/or signal connection. Alternatively, the edge portions of MEMS device 53' may be flip bonded to another package component, and electrical connectors 92 may be bonded to the other package component through solder bonding, metal-to-metal bonding, or the like.

In a subsequent process, composite wafer 53 may be sawed along scribe lines 94, so that composite wafer 53 is singulated into a plurality of identical packages 53', which are also MEMS devices. The respective process is illustrated as process 228 in the process flow 200 as shown in FIG. 26.

FIG. 20 illustrates an apparatus 100, in which MEMS device 53' is placed. Apparatus 100 includes charged particle generator 96 for generating charged particles 98 (such as ions). The apparatus 100 may also include condenser lens 102, condenser aperture 104, condenser particle filter 106, and focus lens 110. Condenser particle filter 106 further includes openings 108. MEMS device 53' may be placed under condenser particle filter 106, with through-holes 60 overlapped by and aligned to the respective overlying openings 108 with a one-to-one correspondence. A target structure 120 to be processed by the charged particles 98 is placed under MEMS device 53'. MEMS device 53' is connected to power through electrical paths 95, which may include, for example, bond wires. In an example embodiment, the target structure 120 includes writer material 114, which may be a metal, a dielectric material, a semiconductor material, or the like. A charge-sensitive material 116 such as a photoresist may be formed on writer material 114.

In an example embodiment, charged particles 98 pass through condenser lens 102 and condenser aperture 104, and are separated into a plurality of charged particle beams by condenser particle filter 106. A proper bias voltage or grounding voltage may be provided to metal pads 52B and hence to the metal layer 84 surrounding through-holes 60, so that the charged particles may pass through, or may be blocked by, the biased metal layer 84. As shown in FIG. 24, MEMS device 53' may include a plurality of regions 90A (and/or 90B), which are electrically insulated from each other, and hence may be applied with different bias voltages. Accordingly, some of the through-holes 60 in MEMS device 53' allow the charged particles 98 to pass through, while some other through-holes 60 in MEMS device 53' block the charged particles 98. Accordingly, the charge-sensitive material 116 will have some portions receiving the charged particles 98, and some other portions not receiving the charged particles 98. The MEMS device 53' may thus be used for photoresist exposure, selective ion implantation, writing lithography mask, and the like.

Figure 23:
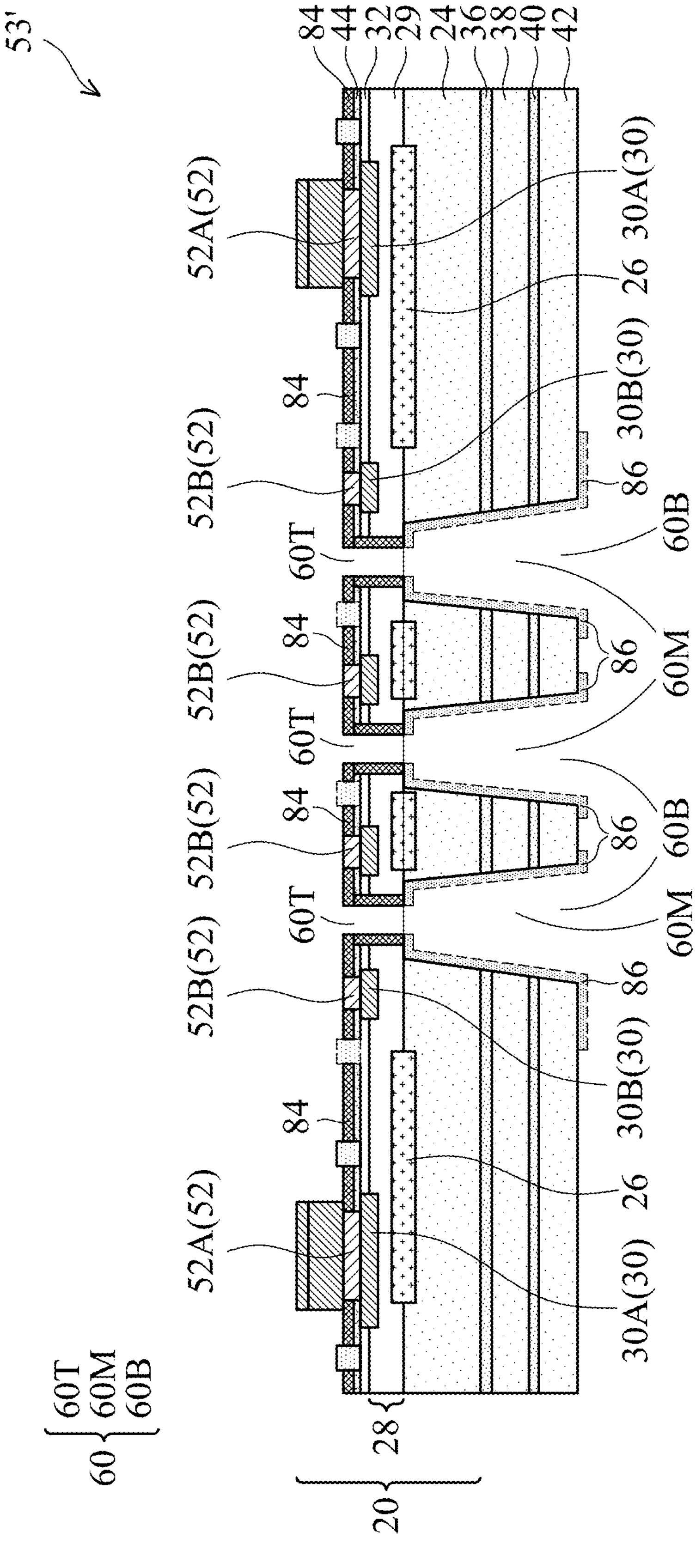
FIG. 23 illustrates a cross-sectional view of a MEMS device in accordance with some embodiments.

FIG. 23 illustrates MEMS device 53' in accordance with alternative embodiments. These embodiments are similar to the embodiments in FIG. 19, except that the sidewalls of semiconductor substrate 24 and supporting substrate 38 and 42 are slanted. The slant angle θ may be greater than about 95 degrees, and may be in the range between about 95 degrees and about 105 degrees. The formation of the slant angle θ may be achieved by adjusting the process conditions for etching supporting substrates 38 and 42 in the processes shown in FIGS. 9 and 10.

The embodiments of the present disclosure have some advantageous features. MEMS devices are formed with through-holes. The lower portions of the through-holes are formed as being wider than the respective upper portions. Accordingly, in the formation of a metal layer extending into the through-holes, the likelihood of metal peeling is reduced, and hence the paths control of the charged particles is improved and may be more precise.

In accordance with some embodiments, a method comprises forming an interconnect structure over a semiconductor substrate, wherein the interconnect structure comprises a plurality of dielectric layers, and wherein the interconnect structure and the semiconductor substrate are comprised in a wafer; forming a plurality of metal pads over the interconnect structure; forming a plurality of through-holes penetrating through the wafer, wherein the plurality of through-holes comprise top portions penetrating through the interconnect structure; and middle portions underlying and joining to the top portions, wherein the middle portions are wider than respective ones of the top portions; and forming a first metal layer electrically connected to the plurality of metal pads, wherein the first metal layer extends into the top portions of the plurality of through-holes.

In an embodiment, the forming the first metal layer comprises a first deposition process performed from a front side of the wafer, and the method further comprises forming a second metal layer electrically connected to the plurality of metal pads, wherein the second metal layer extends into the middle portions of the through-holes, wherein the forming the second metal layer comprises a second deposition process, and wherein the second deposition process is performed from a backside of the wafer. In an embodiment, the forming the plurality of through-holes comprises performing a first etching process to etch the interconnect structure, wherein the wafer is etched from a front side of the wafer to form the top portions of the plurality of through-holes; and performing a second etching process to etch the semiconductor substrate, wherein the wafer is etched from a backside of the wafer to form the middle portions of the plurality of through-holes.

In an embodiment, the method further comprises bonding a first supporting substrate on the semiconductor substrate, wherein the first supporting substrate is etched in the second etching process, and the middle portions of the through-holes extend into the first supporting substrate. In an embodiment, the method further comprises bonding a second supporting substrate on the first supporting substrate; and before the second etching process, performing a third etching process, wherein the second supporting substrate is etched from the backside of the wafer to form bottom portions of the plurality of through-holes.

In an embodiment, the forming the plurality of through-holes comprises performing an anisotropic etching process to form the top portions and the middle portions of the plurality of through-holes; and after the anisotropic etching process, performing an isotropic etching process to laterally expand the middle portions of the plurality of through-holes. In an embodiment, after the first metal layer is formed, bottommost ends of the first metal layer are substantially level with a top surface of the semiconductor substrate.

In an embodiment, the method further comprises performing a sawing process on the wafer, wherein at a time of the sawing process, a sidewall of the semiconductor substrate is exposed to one of the middle portions of the through-holes. In an embodiment, the first metal layer electrically short the plurality of metal pads. In an embodiment, the method further comprises forming isolation regions to electrically isolate the first metal layer into a plurality of parts, wherein each of the plurality of parts is electrically connected to one of the plurality of metal pads.

In accordance with some embodiments, a structure comprises a semiconductor substrate; an interconnect structure over the semiconductor substrate, wherein the interconnect structure comprises a plurality of dielectric layers; a plurality of metal pads over the interconnect structure, wherein the plurality of metal pads are electrically connected to the interconnect structure; a plurality of through-holes penetrating through the interconnect structure and the semiconductor substrate, wherein the plurality of through-holes comprise top portions penetrating through the interconnect structure; and middle portions underlying and joining to the top portions, wherein the middle portions are wider than respective top portions; and a first metal layer electrically connected to the plurality of metal pads, wherein the first metal layer extends into the top portions of the plurality of through-holes.

In an embodiment, the first metal layer has bottom ends at substantially a same level as an interface between the interconnect structure and the semiconductor substrate. In an embodiment, from the top portions to the middle portions, first widths of the top portions abruptly change to second widths of the middle portions. In an embodiment, the structure further comprises a second metal layer extend into the middle portions of the through-holes, wherein the second metal layer and the first metal layer form distinguishable interfaces. In an embodiment, the structure further comprises a first supporting substrate bonded to the semiconductor substrate, wherein the middle portions of the through-holes extend into the first supporting substrate. In an embodiment, the structure further comprises a second supporting substrate bonded to the first supporting substrate, wherein the plurality of through-holes further comprise bottom portions in the second supporting substrate. In an embodiment, the bottom portions of the plurality of through-holes are wider than the middle portions.

In accordance with some embodiments, a structure comprises a semiconductor substrate; a plurality of dielectric layers over the semiconductor substrate; a plurality of through-holes penetrating through the plurality of dielectric layers and the semiconductor substrate, wherein the plurality of through-holes comprises top portions penetrating through the plurality of dielectric layers; and middle portions under and joining to the top portions, wherein bottom widths of the top portions are greater than top widths of the middle portions; and a first metal layer comprising a top portion overlapping the plurality of dielectric layers; and sidewall portions extending into the top portions of the plurality of through-holes. In an embodiment, the structure further comprises a second metal layer extending into the middle portions, wherein the second metal layer forms a horizontal interface with one of the plurality of dielectric layers. In an embodiment, the structure further comprises a supporting substrate underlying and bonding to the semiconductor substrate, wherein the middle portions further extend into the supporting substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming an interconnect structure over a semiconductor substrate, wherein the interconnect structure comprises a plurality of dielectric layers, and wherein the interconnect structure and the semiconductor substrate are comprised in a wafer;
- forming a plurality of metal pads over the interconnect structure;
- forming a plurality of through-holes penetrating through the wafer, wherein the plurality of through-holes comprise:
  - top portions penetrating through the interconnect structure; and
  - middle portions underlying and joining to the top portions, wherein the middle portions are wider than respective ones of the top portions;
- forming a first metal layer electrically connected to the plurality of metal pads, wherein the first metal layer extends into the top portions of the plurality of through-holes, wherein the forming the first metal layer comprises a first deposition process performed from a front side of the wafer; and
- forming a second metal layer electrically connected to the plurality of metal pads, wherein the second metal layer extends into the middle portions of the through-holes, wherein the forming the second metal layer comprises a second deposition process, and wherein the second deposition process is performed from a backside of the wafer.

2. The method of claim 1, wherein the forming the plurality of through-holes comprises:
- performing a first etching process to etch the interconnect structure, wherein the wafer is etched from the front side of the wafer to form the top portions of the plurality of through-holes; and
- performing a second etching process to etch the semiconductor substrate, wherein the wafer is etched from the backside of the wafer to form the middle portions of the plurality of through-holes.

3. The method of claim 2 further comprising:
- bonding a first supporting substrate on the semiconductor substrate, wherein the first supporting substrate is etched in the second etching process, and the middle portions of the through-holes extend into the first supporting substrate.

4. The method of claim 3 further comprising:
- bonding a second supporting substrate on the first supporting substrate; and
- before the second etching process, performing a third etching process, wherein the second supporting substrate is etched from the backside of the wafer to form bottom portions of the plurality of through-holes.

5. The method of claim 1, wherein the forming the plurality of through-holes comprises:
- performing an anisotropic etching process to form the top portions and the middle portions of the plurality of through-holes; and
- after the anisotropic etching process, performing an isotropic etching process to laterally expand the middle portions of the plurality of through-holes.

6. The method of claim 1, wherein after the first metal layer is formed, bottommost ends of the first metal layer are substantially level with a top surface of the semiconductor substrate.

7. The method of claim 6 further comprising performing a sawing process on the wafer, wherein at a time of the sawing process, a sidewall of the semiconductor substrate is exposed to one of the middle portions of the through-holes.

8. The method of claim 1, wherein the first metal layer electrically short the plurality of metal pads.

9. The method of claim 1 further comprising forming isolation regions to electrically isolate the first metal layer into a plurality of parts, wherein each of the plurality of parts is electrically connected to one of the plurality of metal pads.

10. A method comprising:
- forming an interconnect structure over a semiconductor substrate, wherein the interconnect structure comprises a plurality of dielectric layers;
- forming a plurality of metal pads over the interconnect structure, wherein the plurality of metal pads are electrically connected to the interconnect structure;
- forming a plurality of through-holes penetrating through the interconnect structure and the semiconductor substrate, wherein the plurality of through-holes comprise:
  - top portions penetrating through the interconnect structure; and
  - middle portions underlying and joining to the top portions, wherein the middle portions are wider than respective top portions; and
- depositing a first metal layer, wherein the first metal layer is electrically connected to the plurality of metal pads, and wherein the first metal layer extends into the top portions of the plurality of through-holes, wherein after the first metal layer is formed, a first part of a through-hole in the plurality of through-holes is occupied by an inner portion of the first metal layer, and a second part of the through-hole remains as an air gap, and wherein the inner portion of the first metal layer is exposed to the air gap.

11. The method of claim 10, wherein the first metal layer is deposited as comprising bottom ends at substantially a same level as an interface between the interconnect structure and the semiconductor substrate.

12. The method of claim 10, wherein from the top portions to the middle portions, first widths of the top portions abruptly change to second widths of the middle portions.

13. The method of claim 10 further comprising forming a second metal layer extend into the middle portions of the through-holes, wherein the second metal layer and the first metal layer form distinguishable interfaces.

14. The method of claim 10 further comprising:

bonding a first supporting substrate to the semiconductor substrate, wherein the middle portions of the through-holes extend into the first supporting substrate.

15. The method of claim 14 further comprising:

bonding a second supporting substrate to the first supporting substrate, wherein the plurality of through-holes further comprise bottom portions in the second supporting substrate.

16. The method of claim 15, wherein the bottom portions of the plurality of through-holes are wider than the middle portions.

17. A method comprising:

forming a plurality of dielectric layers over a semiconductor substrate;

forming a plurality of through-holes penetrating through the plurality of dielectric layers and the semiconductor substrate, wherein the plurality of through-holes comprises:

top portions penetrating through the plurality of dielectric layers; and middle portions under and joining to the top portions, wherein bottom widths of the top portions are greater than top widths of the middle portions; and depositing a first metal layer, wherein the first metal layer comprises:

a top portion overlapping the plurality of dielectric layers; and sidewall portions extending into the top portions of the plurality of through-holes, wherein bottommost ends of the sidewall portions are substantially higher than the middle portions.

18. The method of claim 17 further comprising:

depositing a second metal layer comprising portions in the middle portions, wherein the second metal layer forms a horizontal interface with one of the plurality of dielectric layers.

19. The method of claim 18, wherein the first metal layer and the second metal layer are deposited from opposite sides of the semiconductor substrate.

20. The method of claim 17 further comprising:

bonding a supporting substrate to the semiconductor substrate, wherein the middle portions further extend into the supporting substrate.

* * * * *